United States Patent
Han et al.

(10) Patent No.: US 11,270,933 B2
(45) Date of Patent: Mar. 8, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Sang-Il Han, Seoul (KR); Sunghee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/038,085

(22) Filed: Sep. 30, 2020

(65) Prior Publication Data

US 2021/0202371 A1    Jul. 1, 2021

(30) Foreign Application Priority Data

Dec. 30, 2019  (KR) .................. 10-2019-0177895

(51) Int. Cl.
*H01L 23/522* (2006.01)
*H01L 23/528* (2006.01)
*H01L 23/00* (2006.01)

(52) U.S. Cl.
CPC ........ *H01L 23/5222* (2013.01); *H01L 23/528* (2013.01); *H01L 24/06* (2013.01)

(58) Field of Classification Search
CPC .... H01L 23/5222; H01L 23/528; H01L 24/06
See application file for complete search history.

(56) References Cited

U.S. PATENT DOCUMENTS

| | | | |
|---|---|---|---|
| 6,639,243 B2 | 10/2003 | Gonzalez et al. | |
| 7,462,912 B2 | 12/2008 | Ahn et al. | |
| 7,903,449 B2 | 3/2011 | Kajigaya et al. | |
| 8,143,699 B2 | 3/2012 | Ching et al. | |
| 8,258,574 B2 | 9/2012 | Han | |
| 8,350,307 B2 | 1/2013 | Kim | |
| 8,604,531 B2 | 12/2013 | Tu | |
| 2004/0229428 A1* | 11/2004 | Cho | H01L 27/10897 438/253 |
| 2006/0289932 A1* | 12/2006 | Ahn | H01L 27/0207 257/334 |

\* cited by examiner

*Primary Examiner* — Marc Anthony Armand
(74) *Attorney, Agent, or Firm* — F. Chau & Associates, LLC

(57) ABSTRACT

A semiconductor device comprises a substrate including a cell array region and a peripheral circuit region that surrounds the cell array region. The cell array region includes landing pads disposed on the substrate and first bottom electrodes disposed on and connected to corresponding landing pads. The peripheral circuit region includes conductive lines disposed on the substrate, a first conductive pad disposed on and spaced apart from the conductive lines, a dielectric pattern disposed between the conductive lines and the first conductive pad, and a plurality of second bottom electrodes disposed on and connected in common to the first conductive pad. A height of each of the first bottom electrodes is greater than a height of each of the second bottom electrodes. Top surfaces of the first bottom electrodes are located at a same level as a level of top surfaces of the second bottom electrodes.

20 Claims, 27 Drawing Sheets

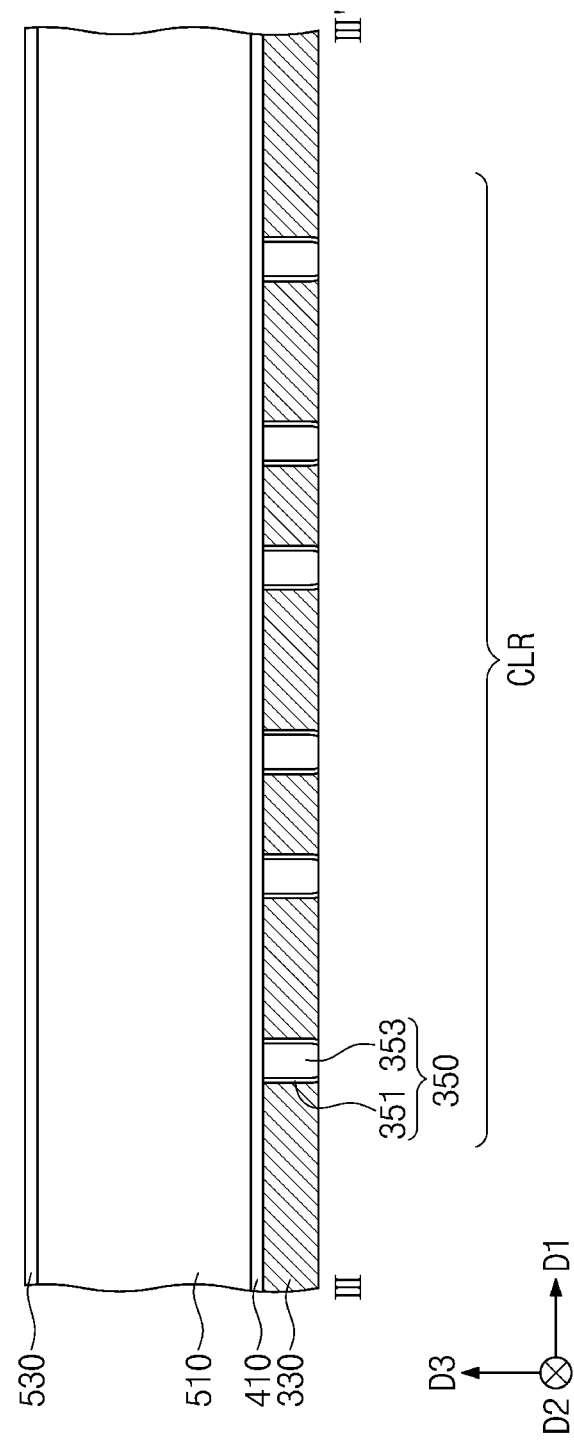

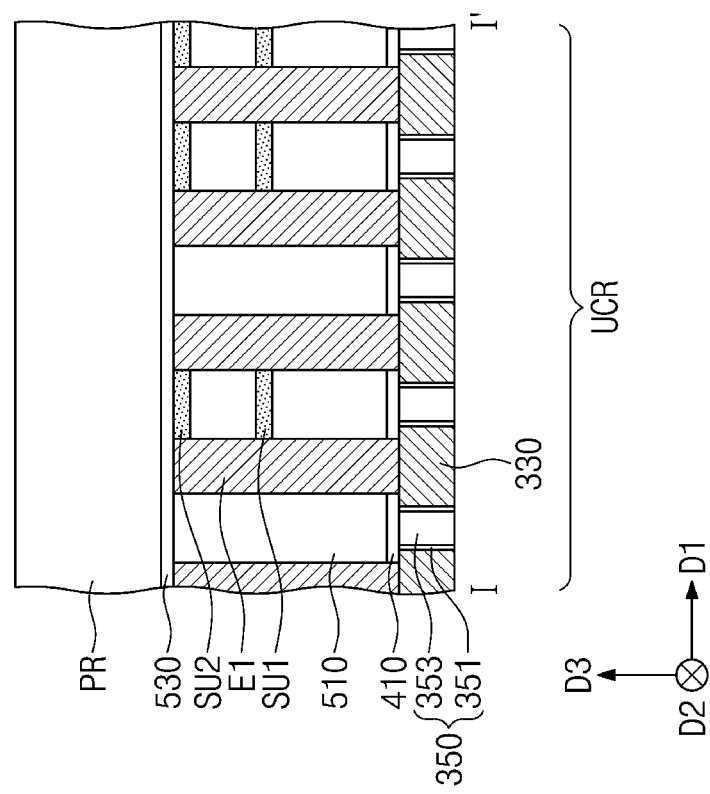

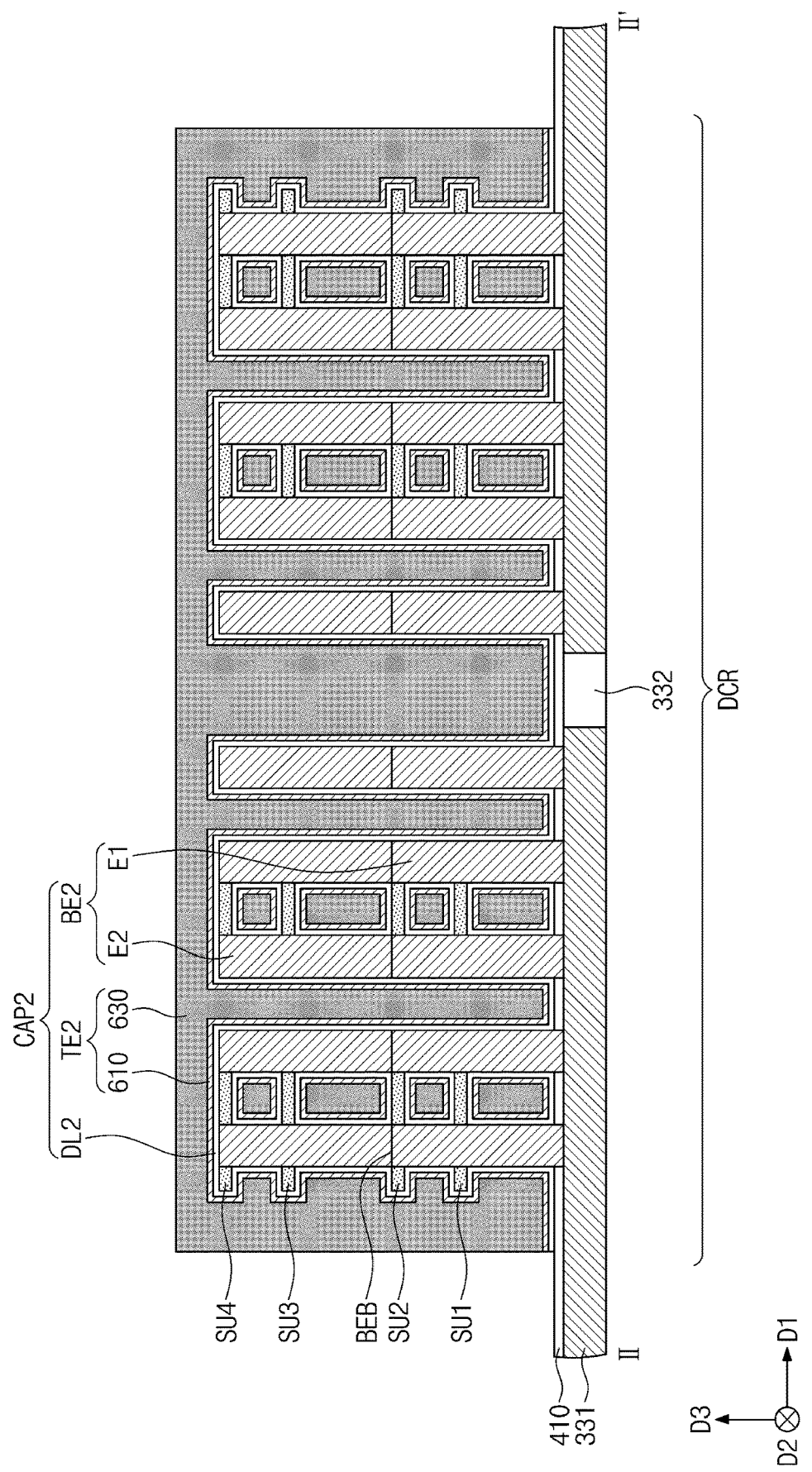

SEMICONDUCTOR DEVICE AND METHOD OF FABRICATING THE SAME

CROSS-REFERENCE TO RELATED APPLICATION

This application claims priority under 35 U.S.C. § 119 to Korean Patent Application No. 10-2019-0177895, filed on Dec. 30, 2019 in the Korean Intellectual Property Office, the disclosure of which is incorporated by reference in its entirety herein.

1. TECHNICAL FIELD

The present inventive concepts relate to a semiconductor device and a method of fabricating the same, and more particularly, to a semiconductor device including a decoupling capacitor and a method of fabricating the same.

2. DISCUSSION OF RELATED ART

Semiconductor devices are considered to be an important factor in the electronic industry because of their small size, multi-functionality, and/or relatively low fabrication cost. Semiconductor devices have increasingly integrated with the development of electronic industry. The line widths of patterns of semiconductor devices to provide high level of integration thereof. However, new exposure techniques and/or expensive exposure techniques are required to provide for the fineness of the patterns. Therefore, it is difficult to highly integrate the semiconductor device. Various studies have recently been conducted for new integration techniques.

As the integration of semiconductor devices increases, there is an increasing demand for semiconductor devices having not only high capacity but also high operating speed. In general, the number of operating circuits increases in proportion to the increase in integration of semiconductor devices. As the number of operating circuits increase, fluctuation noises occur in a power voltage (VDD) and a ground voltage (VSS) during read and write operations. To solve this problem, semiconductor devices commonly use a decoupling capacitor to filter noise between operating voltages such as the power voltage (VDD) and the ground voltage (VSS).

SUMMARY

Some exemplary embodiments of the present inventive concepts provide a semiconductor device having improved electrical characteristics due to an increase in decoupling capacitance and a method of fabricating the same.

An object of the present inventive concepts is not limited to the above-mentioned object, and other objects which have not been mentioned above will be clearly understood to those skilled in the art from the following description.

According to an exemplary embodiment of the present inventive concepts, a semiconductor device includes a substrate including a cell array region and a peripheral circuit region that surrounds the cell array region. The cell array region includes a plurality of landing pads disposed on the substrate. A plurality of first bottom electrodes is disposed on and connected to corresponding landing pads. The peripheral circuit region includes a plurality of conductive lines disposed on the substrate. A first conductive pad is disposed on and spaced apart from the conductive lines. A dielectric pattern is disposed between the conductive lines and the first conductive pad. A plurality of second bottom electrodes is disposed on and connected in common to the first conductive pad. A height of each of the first bottom electrodes is greater than a height of each of the second bottom electrodes. Top surfaces of the first bottom electrodes are located at a same level as a level of top surfaces of the second bottom electrodes.

According to an exemplary embodiment of the present inventive concepts, a semiconductor device may include a substrate including a cell array region and a peripheral circuit region that surrounds the cell array region. A plurality of conductive lines is disposed on the substrate in the peripheral circuit region. A plurality of conductive pads is disposed on and spaced apart from the plurality of conductive lines. The plurality of conductive pads are spaced apart from each other. A plurality of dielectric patterns is disposed between the plurality of conductive lines and the plurality of conductive pads. The plurality of dielectric patterns are spaced apart from each other. A plurality of bottom electrodes is disposed on the plurality of conductive pads. Each of the plurality of bottom electrodes is connected in common to one conductive pad of the plurality of conductive pads. A dielectric layer conformally covers the bottom electrodes. A top electrode is disposed on the dielectric layer and fills spaces between the plurality of bottom electrodes, between the plurality of conductive pads, and between the plurality of dielectric patterns.

According to an exemplary embodiment of the present inventive concepts, a semiconductor device may include a substrate including a cell array region and a peripheral circuit region that surrounds the cell array region. The peripheral circuit region includes a first region and a second region that surrounds the first region. A plurality of word lines is disposed in the cell array region. The plurality of word lines extends in a first direction that is parallel to an upper surface of the substrate. A plurality of bit lines intersects the word lines and extends in a second direction that is parallel to the upper surface of the substrate and perpendicular to the first direction. A plurality of first contacts is disposed between the plurality of bit lines and the substrate. A plurality of second contacts is disposed between adjacent bit lines. The plurality of second contacts directly contacts the substrate. A plurality of landing pads is disposed on corresponding second contacts. A first conductive pad is disposed on the substrate in the first region. A plurality of conductive lines is disposed on the substrate in the second region. Top surfaces of the conductive lines are located at a same level as a level of top surfaces of the landing pads and a top surface of the first conductive pad. A second conductive pad is disposed on and spaced apart from the conductive lines. A dielectric pattern is disposed between the conductive lines and the second conductive pad. A plurality of first bottom electrodes is disposed on and connected to corresponding landing pads in the cell array region. A plurality of second bottom electrodes is disposed on and connected in common to the first conductive pad in the first region. A plurality of third bottom electrodes is disposed on and connected in common to the second conductive pad in the second region. A height of each of the plurality of first and second bottom electrodes is greater than a height of each of the plurality of third bottom electrodes. Top surfaces of the first, second, and third bottom electrodes are located at a same level.

According to an exemplary embodiment of the present inventive concepts, a semiconductor device includes a substrate including a cell array region and a peripheral circuit region that surrounds the cell array region. The peripheral circuit region includes a decoupling region and a connection line region that surrounds the decoupling region. The cell array region includes a plurality of first bottom electrodes, a first dielectric layer disposed to cover the first bottom electrodes and a first top electrode disposed on the first dielectric layer. The connection line region includes a plurality of second bottom electrodes disposed on and connected in common to a first conductive pad, a second dielectric layer disposed to cover the second bottom electrodes and a second top electrode disposed on the second dielectric layer. The decoupling region includes a plurality of conductive lines disposed on the substrate. A second conductive pad disposed on and spaced apart from the plurality conductive lines. A dielectric pattern disposed between the plurality of conductive lines and the second conductive pad. A plurality of third bottom electrodes disposed on and connected in common to the second conductive pad. A third dielectric layer disposed to cover the plurality of third bottom electrodes. A third top electrode disposed on the third dielectric layer. The third top electrode and the second top electrode are electrically connected to each other to form a decoupling capacitor.

BRIEF DESCRIPTION OF THE DRAWINGS

FIGS. 4A to 11A illustrate cross-sectional views taken along line I-I' of FIG. 2, showing a cell array region of a semiconductor device according to exemplary embodiments of the present inventive concepts.

FIGS. 4B to 11B illustrate cross-sectional views taken along line II-II' of FIG. 3, showing a decoupling region of a peripheral circuit region of a semiconductor device according to exemplary embodiments of the present inventive concepts.

FIGS. 4C to 11C illustrate cross-sectional views taken along line III-III' of FIG. 3, showing a connection line region of a peripheral circuit region of a semiconductor device according to exemplary embodiments of the present inventive concepts.

DETAILED DESCRIPTION OF EXEMPLARY EMBODIMENTS

The following will now describe in detail a semiconductor device and a method of fabricating the same according to some exemplary embodiments of the present inventive concepts in conjunction with the accompanying drawings.

Figure 1:
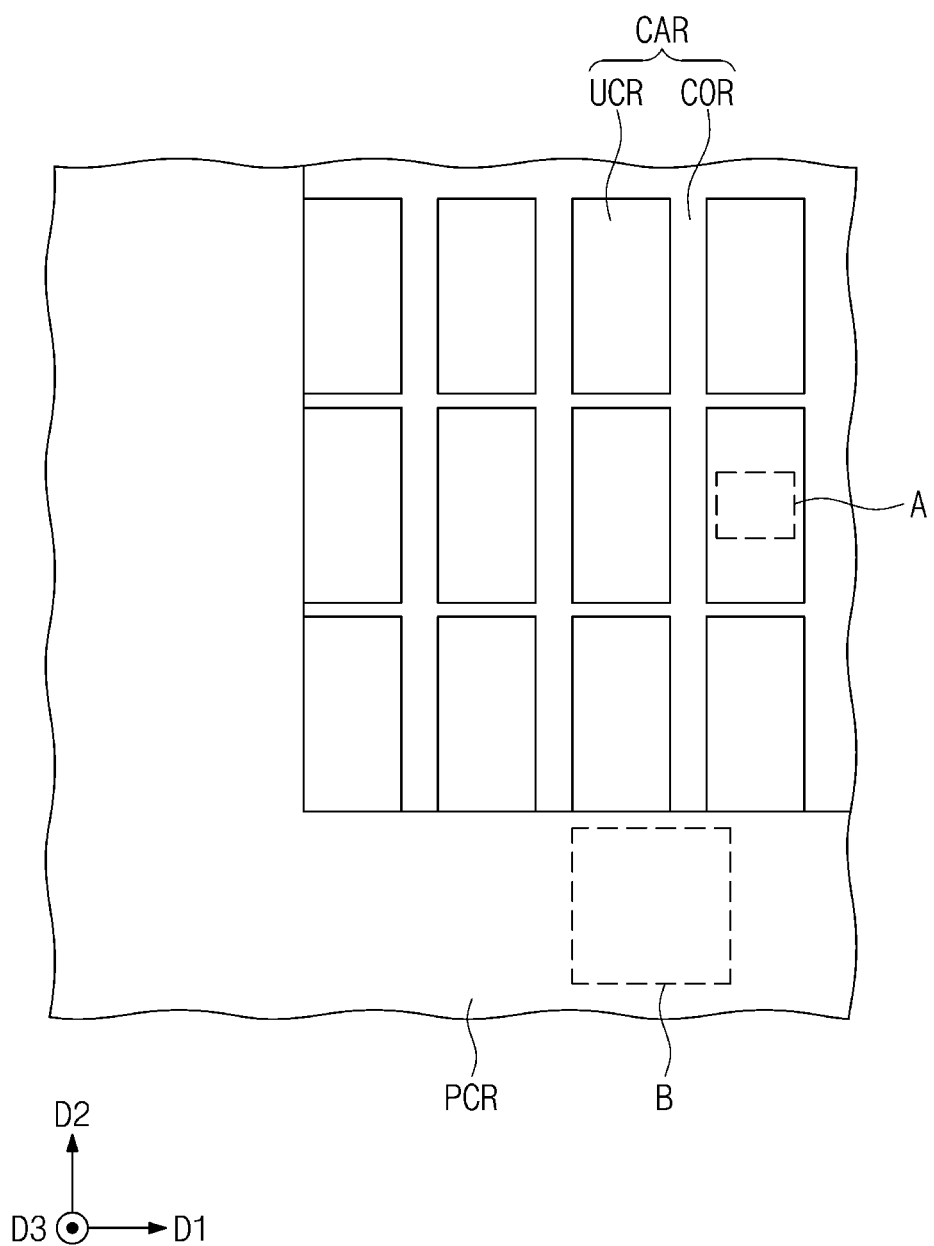
FIG. 1 illustrates a plan view of a semiconductor device according to an exemplary embodiment of the present inventive concepts.

FIG. 1 illustrates a plan view showing a semiconductor device according to at exemplary embodiment of the present inventive concepts.

Referring to the exemplary embodiment of FIG. 1, when viewed in a plan view (e.g., in a plane defined in a first direction D1 and a second direction D2), a semiconductor device may include a cell array region CAR and a peripheral circuit region PCR that surrounds the cell array region CAR. The cell array region CAR may include a plurality of unit cell regions UCR that are spaced apart from each other and a core region COR disposed between the unit cell regions UCR. The unit cell regions UCR may be arranged in the first direction D1 and the second direction D2. As shown in the exemplary embodiment of FIG. 1, the second direction D2 may be perpendicular to the first direction D1. However, exemplary embodiments of the present inventive concepts are not limited thereto. The core region COR may include connection lines that connect the unit cell regions UCR to each other and also connect the peripheral circuit region PCR to each of the unit cell regions UCR. A single unit cell region UCR will be exemplarily explained below for convenience of explanation. The peripheral circuit region PCR may include peripheral circuit transistors and peripheral circuit connection lines.

Figure 2:
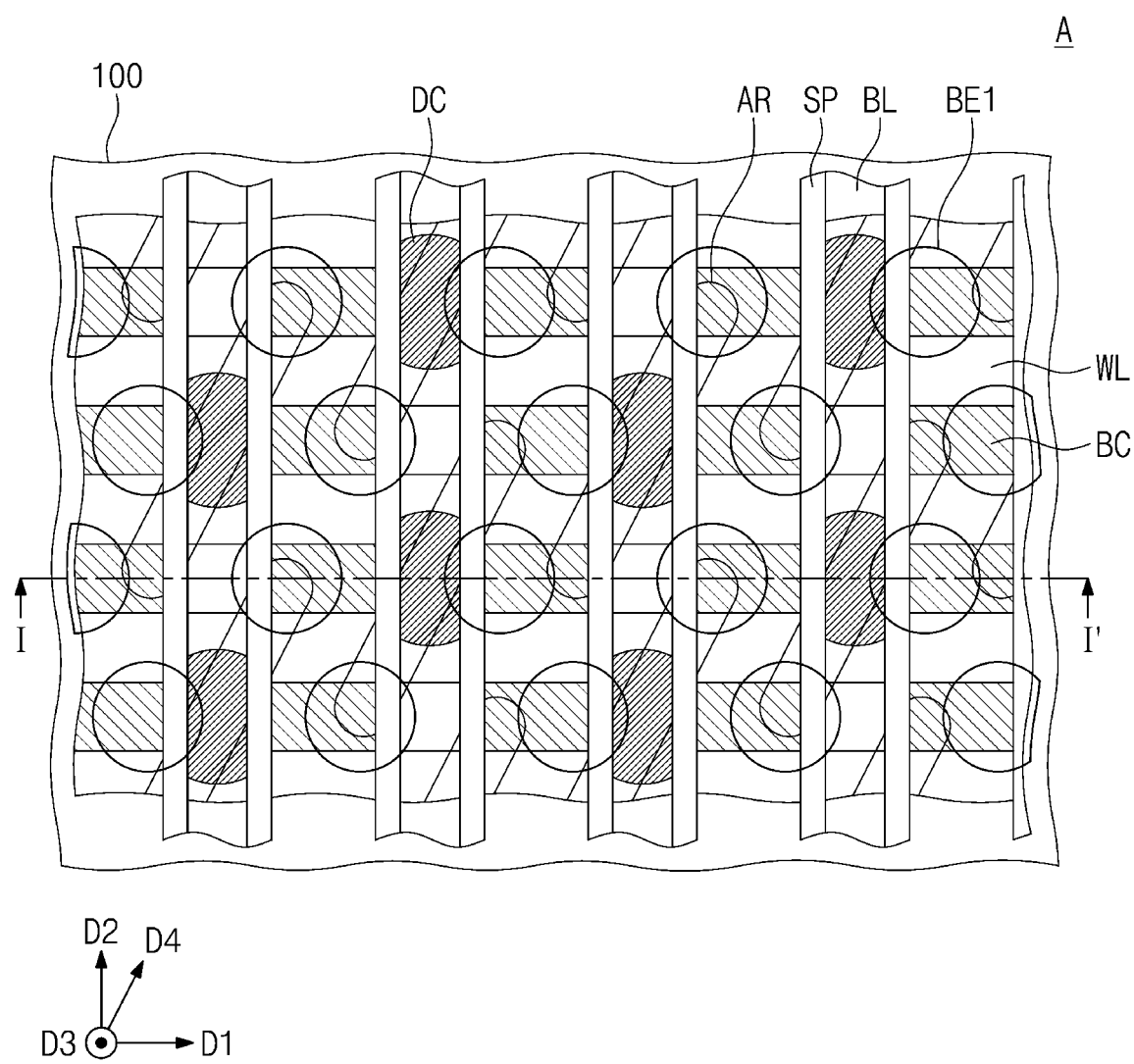
FIG. 2 illustrates an enlarged view of section A of FIG. 1, showing a cell array region of a semiconductor device according to an exemplary embodiment of the present inventive concepts.
Figure 3:
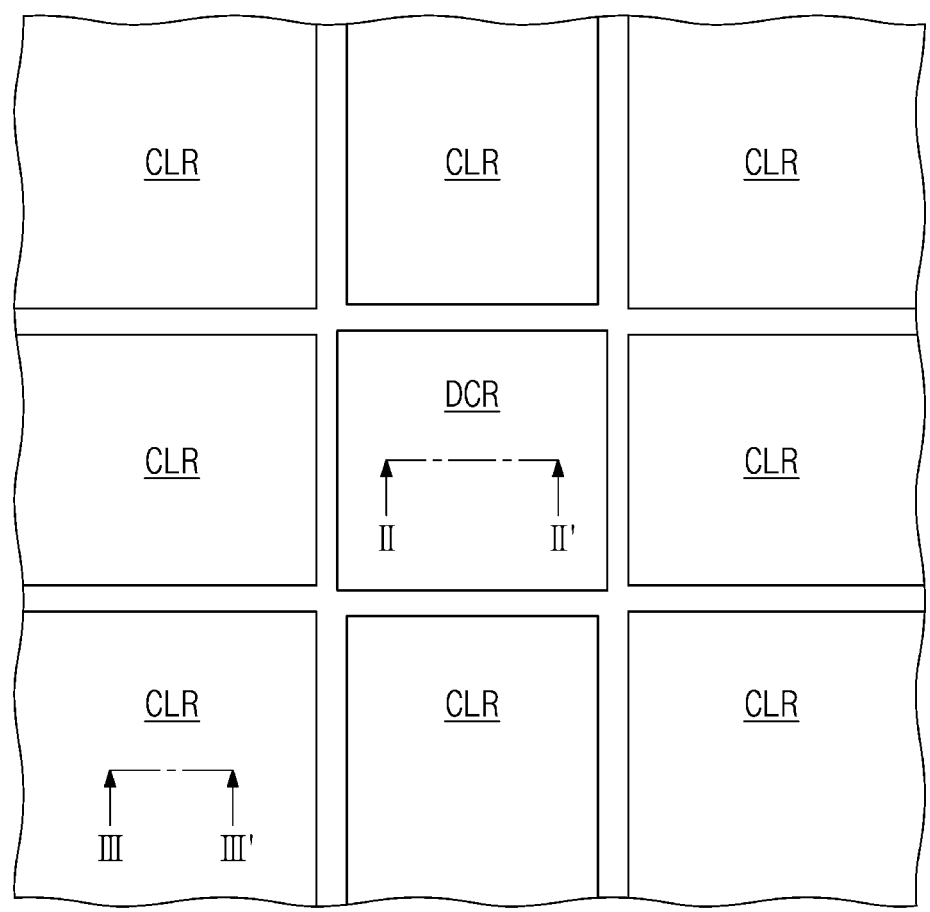
FIG. 3 illustrates an enlarged view of section B of FIG. 1, showing a peripheral circuit region of a semiconductor device according to an exemplary embodiment of the present inventive concepts.

FIG. 2 illustrates an enlarged view of section A of FIG. 1, showing a cell array region of a semiconductor device according to an exemplary embodiment of the present inventive concepts. FIG. 3 illustrates an enlarged view of section B in FIG. 1, showing a peripheral circuit region of a semiconductor device according to an exemplary embodiment of the present inventive concepts.

Referring to the exemplary embodiments of FIGS. 1 and 2, the semiconductor device may include, on the unit cell region UCR, a substrate 100 that includes a plurality of active regions AR, a plurality of word lines WL that extend in the first direction D1, a plurality of bit lines BL that extend in the second direction D2, spacers SP in contact with corresponding sidewalls of the bit lines BL, and a plurality of bottom electrodes, such as first bottom electrodes BE1 that are electrically connected to the active regions AR. A structure of the semiconductor device on the unit cell region UCR will be further discussed below with reference to the exemplary embodiment of FIG. 4A.

Referring to the exemplary embodiments of FIGS. 1 to 3, when viewed in a plan view (e.g., in a plane defined by the first direction D1 and the second direction D2), the peripheral circuit region PCR of the semiconductor device may include a decoupling region DCR and connection line regions CLR that surround the decoupling region DCR. The decoupling region DCR may include decoupling capacitors. The decoupling capacitor may be called a power capacitor. The decoupling capacitor may filter noise between operating powers. The connection line regions CLR may include peripheral circuit lines that are connected to the bit lines BL on the unit cell region UCR. A single connection line region CLR will be exemplarily discussed below.

Figure 4A:
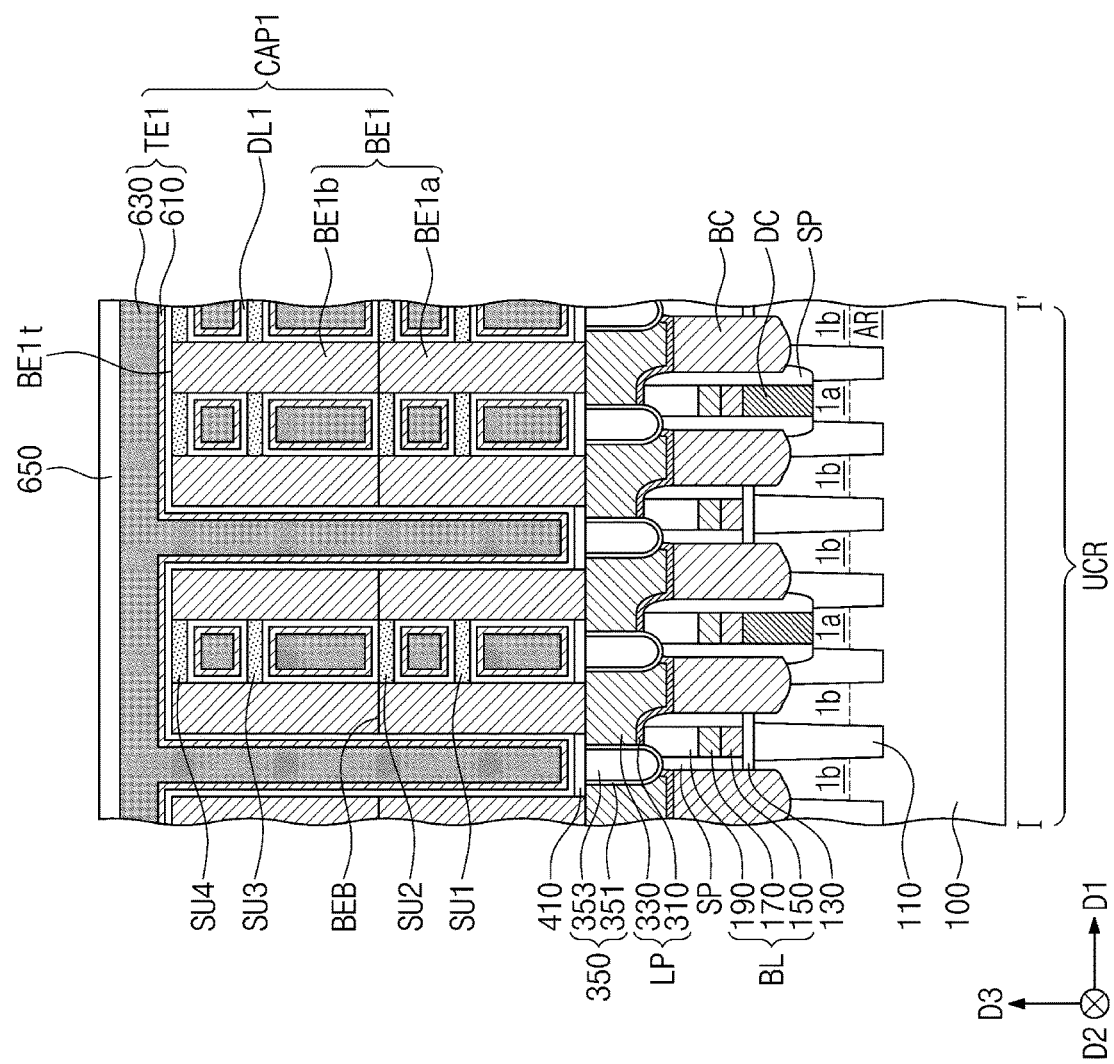
Figure 4B:
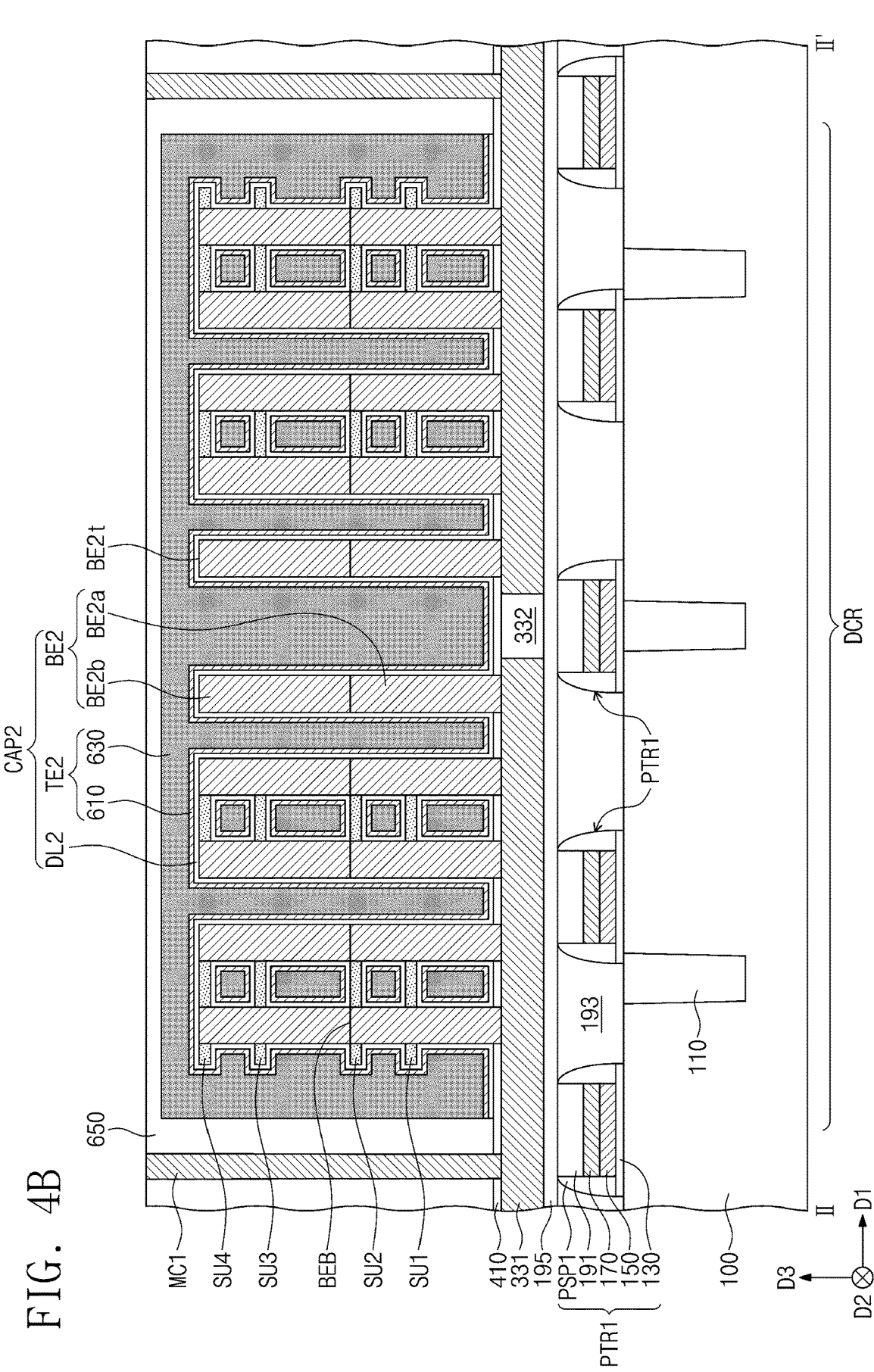

FIGS. 4A, 4B, and 4B illustrate cross-sectional views taken along line I-I' of FIG. 2, along line II-II' of FIG. 3, and along line III-III' of FIG. 3, respectively, showing a semiconductor device according to exemplary embodiments of the present inventive concepts.

In the unit cell region UCR of the semiconductor device with reference to the exemplary embodiments of FIGS. 2 and 4A, the substrate 100 may include a device isolation layer 110 therein. In an exemplary embodiment, the substrate 140 may be a bulk silicon substrate, a silicon-on-insulator (SOI) substrate, a germanium substrate, a germanium-on-insulator (GOI) substrate, a silicon-germanium substrate, or an epitaxial layer substrate obtained by performing selective epitaxial growth (SEG). However, exemplary embodiments of the present inventive concepts are not limited thereto.

The device isolation layer 110 may include a dielectric material. For example, in an exemplary embodiment, the device isolation layer 110 may include silicon oxide. The device isolation layer 110 may define the active rations AR of the substrate 100. The active regions AR may each have an elongated bar shape. The active regions AR may extend in a fourth direction D4. The fourth direction D4 may extend on the same plane on which the first and second directions D1 and D2 extend, and may intersect the first and second directions D1 and D2. For example, the first direction D1, second direction D2 and fourth direction D4 may each be parallel to an upper surface of the substrate 100. The active regions AR may be parallel to each other. The active regions AR may include therein first impurity regions 1a and second impurity regions 1b. The first and second impurity regions 1a and 1b may each have a conductivity type different from the conductivity type of the substrate 100. For example, in an exemplary embodiment in which the substrate 100 is a p-type, the first and second impurity regions 1a and 1b may be a n-type. In another exemplary embodiment in which the substrate 100 is an n-type, the first, and second impurity regions 1a and 1b may be a p-type.

A pair of word lines WL may be disposed on each of the active regions AR of the substrate 100. The word lines WL may extend in the first direction D1. The word lines WL may pass across the active regions AR, while extending in the first direction D1. The word lines WL may be spaced apart from each other in the second direction D2. The word lines WL may be embedded in the active regions AR of the substrate 100. For example, the word lines WL may have top surfaces disposed at a lower level than the level of a top surface of the substrate 100. The word lines WL may include a conductive material. For example, in an exemplary embodiment, the word lines WL may include at least one material selected from impurity-doped polysilicon, metal, metal nitride, metal silicide, and poly-silicide. A gate dielectric pattern may be disposed between the substrate 100 and a sidewall of each of the word lines WL and between the substrate 100 and a bottom surface of each of the word lines WL. In addition, a capping pattern may be disposed between the top surface of the substrate 100 and the top surface of each of the word lines WL. In an exemplary embodiment, the gate dielectric pattern and the capping pattern may include silicon oxide. However, exemplary embodiments of the present inventive concepts are not limited thereto.

A buffer pattern 130 may be disposed on the top surface of the substrate 100. The buffer pattern 130 may include a single-layered dielectric material or a multi-layered stacked dielectric material. In an exemplary embodiment, the buffer pattern 430 may include at least one compound selected from silicon oxide, silicon nitride, and silicon oxynitride.

First contacts DC may be disposed on the active regions AR of the substrate 100. The first contacts DC may be bit-line node contacts. The first contacts DC may penetrate the buffer pattern 130 and may, extend in a third direction D3 perpendicular to the first and second directions D1 and D2. The first contacts DC may be electrically connected to corresponding first impurity regions 1a disposed in the active regions AR of the substrate 100. The first contacts DC may include a conductive material. For example, in an exemplary embodiment, the first contacts DC may include one or more compounds selected from an impurity-doped polysilicon, metal nitride, metal silicide, and poly-silicide.

The bit lines BL may pass across the active regions AR of the substrate 100, while extending in the second direction D2. The bit lines BL may be spaced apart from each other in the first direction D1. The lower surfaces of the bit lines BL may be in direct contact with the first contacts DC or the buffer pattern 130. The bit lines BL may be electrically connected to the first contacts DC.

Each of the bit lines BL may include a first conductive pattern 150, a second conductive pattern 170, and a first dielectric pattern 190 that are sequentially stacked on the substrate 100 (e.g., in the third direction DR3). The second conductive pattern 170 may be disposed between the first conductive pattern 150 and the first dielectric pattern 190 (e.g., in the third direction DR3). In an exemplary embodiment, the first conductive pattern 150 may include polysilicon or doped polysilicon. In an exemplary embodiment, the second conductive pattern 170 may include at least one compound selected from tungsten (W), aluminum (Al), copper (Co), nickel (Ni), and cobalt (Co). In an exemplary embodiment, the first dielectric pattern 190 may include silicon oxide or silicon nitride. However, exemplary embodiments of the present inventive concepts are not limited thereto. In an exemplary embodiment, a diffusion break layer may be interposed between the first conductive pattern 150 and the second conductive pattern 170 (e.g., in the third direction DR3).

Second contacts BC may be disposed on the active regions AR of the substrate 100 between adjacent bit lines BL (e.g., in the first direction D1). The second contacts BC may be storage node contacts. The second contacts BC may extend in the third direction D3 on the active regions AR of the substrate 100. The second contacts BC may each have a width (e.g., length in the first direction D1) that is greater than a width (e.g., length in the first direction D1) of each of the active regions AR. The second contacts BC may each be disposed on one of the active regions AR of the substrate 100 and disposed on the device isolation layer 110 in the adjacent active region AR. The second contacts BC may be electrically connected to corresponding second impurity regions 1b disposed in the active regions AR of the substrate 100. The bottom surfaces of the second contacts BC may be positioned at a higher level (e.g., distance from a lower surface of the substrate 100 in the third direction D3) than the level of the bottom surfaces of the first contacts DC. In an exemplary embodiment, the bottom surfaces of the second contacts BC may be convex in a direction toward the substrate 100. The second contacts BC may have their top surfaces at a level that is lower than a level of a top surface of the first dielectric pattern 190. The sidewalls of the second contacts BC may be spaced apart in the first direction D1 from the bit lines BL. In addition, the sidewalls of the second contacts BC may be spaced apart in the first direction D1 from the first contacts DC. In an exemplary embodiment, the second contacts BC may include at least one material selected from metal, metal nitride, metal silicide, and poly-silicon. However, exemplary embodiments of the present inventive concepts are not limited thereto.

As shown in the exemplary embodiment of FIG. 4A, the spacers SP may be disposed between the first and second conductive patterns 150, 170 of the bit lines BL and the second contacts BC (e.g., in the first direction D1). The spacers SP may also be disposed between the first dielectric pattern 190 of the bit lines BL and the second contacts BC (e.g., in the first direction D1). The spacers SP may also be disposed between the first contacts DC and the second contacts BC (e.g., in the first direction D1). The spacers SP may extend in the third direction D3 on sidewalls of each of the bit lines BL including lateral sidewalls of the first and second conductive patterns 150, 170 and lateral sidewalls of the first dielectric pattern 190. In addition, the spacers SP may extend in the third direction D3 on lateral sidewalls of the first contacts DC and the second contacts BC. The spacers SP may each have a bottom surface in contact with the buffer pattern 130 or the device isolation layer 110. As shown in the exemplary embodiment of FIG. 4A, the bottom surface of the spacers SP in contact with the device isolation layer 110 may also contact an upper surface of an impurity region, such as the first impurity region 1a. In an exemplary embodiment, the bottom surface of each of the spacers SP in contact with the buffer pattern 130 may be coplanar with a top surface of the buffer pattern 130 and a bottom surface of the first conductive pattern 150 included in each of the bit lines BL. The bottom surface of each of the spacers SP in contact with the device isolation layer 110 may be coplanar with the bottom surface of each of first contacts DC. In addition, the bottom surface of each of the spacers SP in contact with the device isolation layer 110 may be located at a lower level than the level of the bottom surface of each of the second contacts BC. For example, the spacers SP may each have a lowermost bottom surface that is positioned at a lower level that the level of an uppermost top surface of the device isolation layer 110 in the substrate 100. In an exemplary embodiment, when viewed in cross-section (e.g., in a plan view in a plane defined in the first direction D1 and third direction D3), each of the spacers SP may have a J-shape at its portion in contact with the device isolation layer 110. In an exemplary embodiment, the spacers SP may include at least one compound selected from silicon nitride and silicon oxide. However, exemplary embodiments of the present inventive concepts are not limited thereto. In other exemplary embodiments, the spacers SP may include air gaps therein.

Landing pads LP may be disposed on corresponding top surfaces of the second contacts BC. The landing pads LP may be electrically connected to the second contacts BC. The landing pads LP may each have a portion disposed on a top surface of each of the bit lines BL adjacent thereto. For example, a bottom surface of the landing pads LP may directly contact a top surface of the first dielectric pattern 190.

The landing pads LP may each include a barrier pattern 310 and a third conductive pattern 330 that are sequentially stacked on each of the second contacts BC (e.g., in the third direction D3). The barrier pattern 310 may be disposed between (e.g., in the third direction D3) the third conductive pattern 330 and the second contacts BC, between the third conductive pattern 330 and the spacers SP, and between the third conductive pattern 330 and a portion of the top surface of the first dielectric pattern 190. In an exemplary embodiment, the barrier pattern 310 may include, for example, TiN, Ti/TiN, TiSiN, TaN, or WN. The third conductive pattern 330 may include metal. For example, the third conductive pattern 330 may include tungsten (W).

A separation pattern 350 may be disposed between adjacent landing pads LP (e.g., in the first direction D1). The separation pattern 350 may surround outer lateral sidewalls of the landing pads LP. A portion of the separation pattern 350 may be embedded in the first dielectric pattern 190. For example, the separation pattern 350 may have a bottom surface disposed between topmost and bottommost surfaces of the first dielectric pattern 190. The bottom surface of the separation pattern 350 may have a portion in contact with one of the spacers SP. The separation pattern 350 may have a top surface at substantially the same level as the top surfaces of the landing pads LP. For example, the top surface of the separation pattern 350 may be coplanar with the top surfaces of the landing pads LP. The separation pattern 350 may include a second dielectric pattern 351 and a third dielectric pattern 353. The second dielectric pattern 351 may be in contact with adjacent lateral sidewalls of the landing pads LP, with a portion of the first dielectric pattern 190, and with a top surface of one of the spacers SP. In an exemplary embodiment, the second dielectric pattern 351 may include tetraethyl orthosilicate (TEOS) or high density plasma (HDP) oxide. However, exemplary embodiments of the present inventive concepts are not limited thereto. The third dielectric pattern 353 may be disposed in an inner space surrounded by the second dielectric pattern 351. In an exemplary embodiment, the third dielectric pattern 353 may include silicon oxide or silicon nitride. However, exemplary embodiments of the present inventive concepts are not limited thereto.

First bottom electrodes BE1 may be disposed on corresponding top surfaces of the landing pads LP. The first bottom electrodes BE1 may extend in the third direction D3 from the corresponding top surfaces of the landing pads LP. As shown in the exemplary embodiment of FIG. 1, when viewed in a plan view (e.g., in a plane defined in the first direction D1 and the second direction D2), the first bottom electrodes BE1 may be arranged in a zigzag fashion along the second direction D2. For example, adjacent first bottom electrodes BE1 in the second direction D2 may be offset in the first direction D1 to form a zigzag arrangement. The first bottom electrodes BE1 may include first parts BE1a and second parts BE1b disposed on the first parts BE1a (e.g., in the third direction D3). In the exemplary embodiment of FIG. 4A, the first and second parts BE1a and BE1b have sidewalls that are aligned with each other. However, exemplary embodiments of the present inventive concepts are not limited thereto. For example, in other exemplary embodiments, the sidewalls of the first and second parts BE1a and BE1b may be misaligned with each other. In addition, in an exemplary embodiment, the second parts BE1b may have their bottom widths (e.g., length in the first direction D1) that is less than top widths of the first parts BE1a that it is disposed thereon. Therefore, a step difference may be provided between the first and second pans BE1a and BE1b. The first bottom electrodes BE1 may each have a bottom-electrode boundary BEB where the first part BE1a is in contact with the second part BE1b. For example, a distance between the bottom-electrode boundary BEB and the top surface of each of the landing pads LP may be the same as a height in the third direction D3 of the first part BE1a of the first bottom electrode BE1. In an exemplary embodiment, the height in the third direction D3 of the first part BE1a of the first bottom electrode BE1 may be in a range from about 500 nm to about 1,500 nm. For example, the height in the third direction D3 of the first part BE1a of the first bottom electrode BE1 may be within a range of about 800 nm to about 1,200 nm. In an exemplary embodiment, the height in the third direction D3 of the second part BE1b of the first bottom electrode BE1 may be substantially the same as the height in the third direction D3 of the first part BE1a of the first bottom electrode BE1. Therefore, a total height in the third direction D3 of the first bottom electrode BE1 may be in a range from about 1,000 nm to about 3,000 nm. For example, the total height in the third direction D3 of the first bottom electrode BE1 may be in a range of about 1,600 nm to about 2,400 nm. The first bottom electrodes BE1 may include a conductive material. For example, in an exemplary embodiment, the first bottom electrodes BE1 may include one or more materials selected from an impurity-doped polysilicon, metal, metal nitride, metal silicide, and polysilicide. As shown in the exemplary embodiment of FIG. 4A, the first bottom electrodes BE1 may each have a pillar shape. However, exemplary embodiments of the present inventive concepts are not limited thereto. For example, in other embodiments, the first bottom electrodes BE1 may each have a cylindrical shape having a bottom end that is closed.

First, second, third, and fourth support patterns SU1, SU2, SU3, and SU4 may be disposed between the first bottom electrodes BE1 (e.g., in the first direction D1). Sidewalls of neighboring first bottom electrodes BE1 may be connected to each other through the first to fourth support patterns SU1 to SU4. However, some adjacent first bottom electrodes BE1 may be spaced apart from each other without first, second, third, or fourth support patterns SU1, SU2, SU3, or SU4 therebetween. The first and second support patterns SU1 and SU2 may connect the sidewalls of adjacent first parts BE1a, and the third and fourth support patterns SU3 and SU4 may connect the sidewalls of adjacent second parts BE1b. The second support patterns SU2 may be located at a higher level than the first support patterns SU1, and the fourth support patterns SU4 may be located at a higher level than the third support patterns SU3 and second support patterns SU2. The first to fourth support patterns SU1 to SU4 may be spaced apart from each other in the third direction D3. In the exemplary embodiment of FIG. 4A, the top surfaces of the second support patterns SU2 are coplanar with the bottom-electrode boundary BEB. However, exemplary embodiments of the present inventive concepts are not limited thereto. For example, in other exemplary embodiments, the top surfaces of the second support patterns SU2 may be positioned at a lower level than the bottom-electrode boundary BEB. Likewise, the top surfaces of the fourth support patterns SU4 shown in the exemplary embodiment of FIG. 4A are coplanar with top surfaces BE1t of the first bottom electrodes BE1. However, exemplary embodiments of the present inventive concepts are not limited thereto. For example, in another exemplary embodiment, the top surfaces of the fourth support patterns SU4 may be positioned at a lower level than the top surfaces BE1t of the first bottom electrodes BE1. In an exemplary embodiment, the first to fourth support patterns SU1 to SU4 may vertically overlap each other (e.g., overlap in the third direction D3). In an exemplary embodiment, the first to fourth support patterns SU1 to SU4 may include silicon nitride. However, exemplary embodiments of the present inventive concepts are not limited thereto.

A fourth dielectric pattern 410 may be disposed on the landing pads LP and the separation pattern 350 (e.g., in the third direction DR3). When viewed in a plan view, the fourth dielectric pattern 410 may surround the first bottom electrode BE1. For example, the fourth dielectric pattern 410 may be in contact with the lateral sidewall of the first part BE1a of the first bottom electrode BE1. The fourth dielectric pattern 410 may have a bottom surface, which is in contact with the separation pattern 350 and is coplanar with both the top surface of the separation pattern 350 and the top surfaces of the landing pads LP. As shown in the exemplary embodiment of FIG. 4A, the bottom surface of the fourth dielectric pattern 410 may completely cover the top surface of the separation pattern 350 (e.g., in the first direction D1). The fourth dielectric pattern 410 may have a top surface located at a lower level than bottom surfaces of the first support patterns SU1. In an exemplary embodiment, the fourth dielectric pattern 410 may include silicon nitride. However, exemplary embodiments of the present inventive concepts are not limited thereto.

A first dielectric layer DL1 may be disposed to conformally cover the first bottom electrodes BE1 and the first to fourth support patterns SU1 to SU4. For example, the first dielectric layer DL1 may conformally cover the top surfaces BE1t and lateral sidewalls of the first bottom electrodes BE1, the top and bottom surfaces of the first to fourth support patterns SU1 to SU4, and the top surface 410t of the fourth dielectric pattern 410. In an exemplary embodiment, the first dielectric layer DL1 may include at least one compound selected from oxide, nitride, silicide, oxynitride, and silicide oxynitride including one or more of hafnium (Hf), aluminum (Al), zirconium (Zr), and lanthanum (La).

A first top electrode TE1 may be disposed on the first dielectric layer DL1. The first top electrode TE1 may include a first conductive layer 610 and a second conductive layer 630. The first top electrode TE1, the first bottom electrodes BE1, and the first dielectric layer DL1 may constitute first capacitors CAP1. The first capacitor CAP1 on the unit cell region UCR may be called a data storage capacitor or a cell capacitor. For example, the first capacitor CAP1 on the unit cell region UCR may serve as a data storage element for allowing the semiconductor device to function as a memory device. The first conductive layer 610 may conformally cover the first dielectric layer DL1. In an exemplary embodiment, the first conductive layer 610 may include titanium nitride. However, exemplary embodiments of the present inventive concepts are not limited thereto. The second conductive layer 630 may be disposed on the first conductive layer 610. The second conductive layer 630 may fill spaces between the sidewalls of the first bottom electrodes BE1 and between the first to fourth support patterns SU1 to SU4. The second conductive layer 630 may cover an uppermost top surface of the first conductive layer 610. For example, the second conductive layer 630 may have a top surface at a higher level than the uppermost top surface of the first conductive layer 610. However, exemplary embodiments of the present inventive concepts are not limited thereto. For example, in an exemplary embodiment in which the first bottom electrodes BE1 have their cylindrical shapes having closed bottom ends, the second conductive layer 630 may fill insides of the cylindrical shapes. In an exemplary embodiment, the second conductive layer 630 may include an impurity-doped silicon-germanium. However, exemplary embodiments of the present inventive concepts are not limited thereto.

An upper dielectric layer 650 may be disposed on top surfaces of the first top electrode TE1. The upper dielectric layer 650 may cover the first top electrode TE1 and may not externally expose the first top electrode TE1. The upper dielectric layer 650 may include a dielectric material. In an exemplary embodiment, the upper dielectric layer 650 may include at least one compound selected from tetraethyl orthosilicate (TEOS), plasma enhanced TEOS, boron phosphorus silicate glass (BPSG), phosphorus silicate glass (PSG), an high density plasma (HDP) oxide.

The following will discuss the decoupling region DCR of the semiconductor device according to the exemplary embodiment of the present inventive concepts shown in FIG. 4B in comparison with the exemplary embodiment of FIG. 4A. Those components identified with the same reference numeral in the exemplary embodiments of FIGS. 4A and 4B may be formed in substantially the same process and may include substantially the same material. It is noted that the same features as those discussed with reference to the exemplary embodiment of FIG. 4A will be omitted for convenience of description.

A plurality of first peripheral transistors PTR1 may be disposed on the substrate 100 in the decoupling region DCR. The first peripheral transistors PTR1 may each include a buffer pattern 130, a first conductive pattern 150, a second conductive pattern 170, a peripheral capping pattern 191, and a first peripheral spacer PSP1. The buffer pattern 130 may be disposed between the first conductive pattern 150 and the substrate 100 (e.g., in the third direction D3). The first conductive pattern 150 and the second conductive pattern 170 may be disposed between the buffer pattern 130 and the peripheral capping pattern 191 (e.g., in the third direction D3). The first peripheral spacer PSP1 may surround the first and second conductive patterns 150 and 170 and the peripheral capping pattern 191. For example, as shown in the exemplary embodiment of FIG. 4B, the first peripheral spacer PSP1 may directly contact lateral sidewalls of first and second conductive patterns 150 and 170 and the peripheral capping pattern 191. In an exemplary embodiment, the first peripheral transistors PTR1 may be dummy patterns that are irrelevant to the operation of the semiconductor device according to an exemplary embodiment of the present inventive concepts.

A first interlayer dielectric layer 193 may be disposed to surround the first peripheral transistors PTR1 (e.g., in the first direction D1), and a second interlayer dielectric layer 195 may be disposed on the first peripheral transistors PTR1 and the first interlayer dielectric layer 193 (e.g., in the third direction D3). In an exemplary embodiment, the first and second interlayer dielectric layers 193 and 195 may include silicon oxide or silicon nitride. However, exemplary embodiments of the present inventive concepts are not limited thereto.

First conductive pads 331 may be disposed on the second interlayer dielectric layer 195 (e.g., in the third direction D3). The first conductive pads 331 may be called common electrodes. In an exemplary embodiment, the top surfaces of the first conductive pads 331 may be positioned at substantially the same level as the top surfaces of the landing pads LP on the unit cell region UCR. In an exemplary embodiment, the first conductive pads 331 may be formed of substantially the same material in substantially the same process used for forming the third conductive pattern 330 on the unit cell region UCR. For example, the first conductive pads 331 may include tungsten (W). A third interlayer dielectric layer 332 may be interposed between the first conductive pads 331. For example, the first conductive pads 331 may be spaced apart from each other (e.g., in the first direction D1), with the third interlayer dielectric layer 332 disposed therebetween. As shown in the exemplary embodiment of FIG. 4B, the third interlayer dielectric layer 332 may have a top surface coplanar with the top surface of the first conductive pads 331. In an exemplar embodiment, the third interlayer dielectric layer 332 may include the same dielectric material as the material of one of the first and second interlayer dielectric layers 193 and 195.

Second bottom electrodes BE2 may be disposed on the first conductive pads 331 (e.g., in the third direction D3). In an exemplary embodiment, the second bottom electrodes BE2 may be formed of substantially the same material in substantially the same process used for forming the first bottom electrodes BE1 on the unit cell region UCR. A plurality of second bottom electrodes BE2 may be disposed on each of the first conductive pads 331 and may be spaced apart from each other (e.g., in the first direction D1). For example, a plurality of second bottom electrodes BE2 may be connected in common to one of the first conductive pads 331. The second bottom electrodes BE2 may extend in the third direction D3 from the top surfaces of the first conductive pads 331. The second bottom electrodes BE2 may include first parts BE2a and second parts BE2b disposed on the first parts BE2a. A contact surface between the first and second parts BE2a and BE2b of the second bottom electrodes BE2 forms a bottom-electrode boundary BEB and may be located at substantially the same level as the bottom-electrode boundary BEB between the first parts BE1a and second parts BE1b of the first bottom electrodes BE1 on the unit cell region UCR. For example, a distance between the bottom-electrode boundary BEB and the top surfaces of the first conductive pads 331 may be the same as a height in the third direction D3 of the first part BE2a of the second bottom electrode BE2. A total height in the third direction D3 of the second bottom electrode BE2 may be substantially the same as the total height in the third direction D3 of the first bottom electrode BE1 on the unit cell region UCR. The second bottom electrodes BE2 may have top surfaces BE2t at substantially the same level as the top surfaces BE1t of the first bottom electrodes BE1 on the unit cell region UCR.

A second dielectric layer DL2 and a second top electrode TE2 may be sequentially disposed on the second bottom electrodes BE2. The second dielectric layer DL2 formed on the second bottom electrodes BE2 may be formed of the same material in the same process used for forming the first dielectric layer DL1 on the unit cell region UCR. In an exemplary embodiment, the second top electrodes TE2 may be formed of the same material in the same process used for forming the first top electrode TE1 on the unit cell region UCR. The second bottom electrodes BE2, the second dielectric layer DL2, and the second top electrode TE2 may constitute second capacitors CAP2. The second capacitor CAP2 on the decoupling region DCR may be called a decoupling capacitor or a power capacitor. The second capacitor CAP2 on the decoupling region DCR may filter noise between operating powers.

The upper dielectric layer 650 in the decoupling region DCR may directly contact top surfaces and lateral sidewall surfaces of the second conductive layer 630 and may directly contact top surfaces of the fourth dielectric pattern 410 disposed on the first conductive pads 331. First contact plugs MC1 may be disposed to penetrate the upper dielectric layer 650 in the vicinity of the second top electrode TE2. The first contact plugs MC1 may extend in the third direction D3 to penetrate the upper dielectric layer 650 and the fourth dielectric pattern 410, and may have electrical connection with corresponding first conductive pads 331. The first conductive pads 331 may be connected in parallel to each other through the first contact plugs MC1. Therefore, the decoupling capacitance may increase. While the exemplary embodiment shown in FIG. 4B includes a bottom surface of the first contact plugs MC1 directly contacting a top surface of the first conductive pads 331, exemplary embodiments of the present inventive concepts are not limited thereto. For example, in other exemplary embodiments, portions of the first contact plugs MC1 may be embedded in the first conductive pads 331. For example, the first contact plugs MC1 may extend within the first conductive pads 331 and may have bottom surfaces at a lower level than the top surfaces of the first conductive pads 331.

Figure 4C:
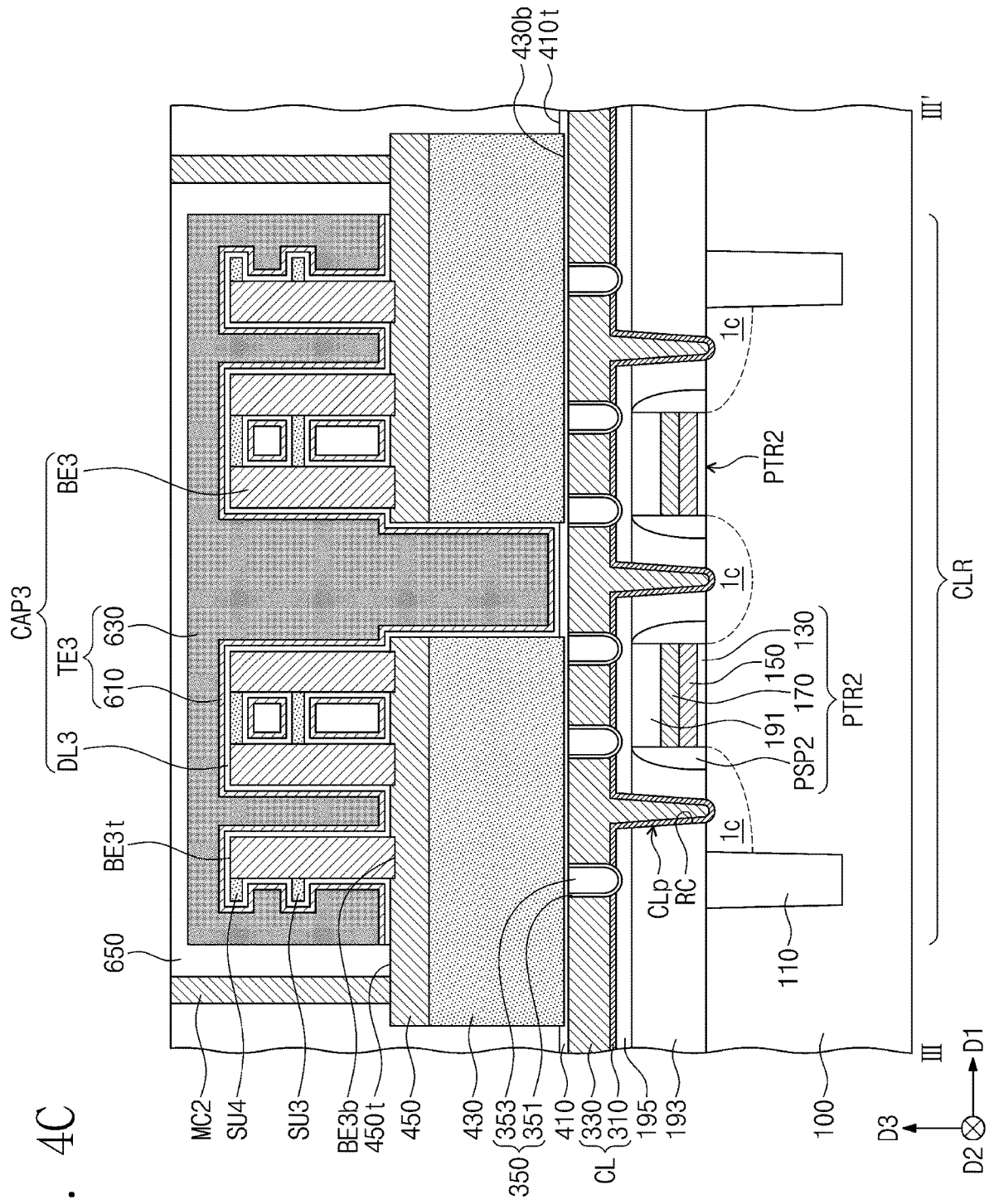

The following will discuss the connection line region CLR of the semiconductor device according to an exemplary embodiment of the present inventive concepts with reference to FIG. 4C in comparison with the exemplary embodiments of FIGS. 4A and 4B. Those components identified with the same reference numeral in the exemplary embodiments of FIGS. 4A, 4B, and 4C may be formed in substantially the same process and may include substantially the same material. It is noted that the same features as those discussed with reference to the exemplary embodiments of FIGS. 4A and 4B will be omitted for convenience of description A plurality of second peripheral transistors PTR2 may be disposed on the substrate 100. The second peripheral transistors PTR2 may each include a buffer pattern 130, a first conductive pattern 150, a second conductive pattern 170, a peripheral capping pattern 191, and a second peripheral spacer PSP2. As shown in the exemplary embodiment of FIG. 4C, the buffer pattern 130, the first conductive pattern 150, the second conductive pattern 170 and the peripheral capping pattern 191 may be consecutively stacked on each other (e.g., in the third direction D3). The buffer pattern 130 of each of the second peripheral transistors PTR2 may be a gate dielectric pattern. The second peripheral spacer PSP2 may surround the buffer pattern 130, the first and second conductive patterns 150 and 170, and the peripheral capping pattern 191. For example, as shown in the exemplary embodiment of FIG. 4C, the second peripheral spacer PSP2 may contact lateral sidewalls of the buffer pattern 130, the first conductive pattern 150, the second conductive pattern 170, and the peripheral capping pattern 191 (e.g., in the first direction D1). The second peripheral transistors PTR2 may be transistors that control electrical signals of peripheral circuit lines.

A first interlayer dielectric layer 193 may be disposed to surround the second peripheral transistors PTR2 (e.g., in the first direction D1), and a second interlayer dielectric layer 195 may be disposed on the second peripheral transistors PTR2 and the first interlayer dielectric layer 193. For example, as shown in the exemplary embodiment of FIG. 4C, a bottom surface of the second interlayer dielectric layer 195 may directly contact upper surfaces of the first interlayer dielectric layer 193 and the second peripheral transistors PTR2. A recess RC may extend from the first and second interlayer dielectric layers 193 and 195 toward an upper portion of the substrate 100. Conductive lines CL and a separation pattern 350 may be disposed on the second interlayer dielectric layer 195. At least one of the conductive lines CL may have a protrusion CLp that penetrates the first and second interlayer dielectric layers 193 and 195 and extends toward an upper surface of the substrate 100. The protrusion CLp may fill the recess RC. In addition, the protrusion CLp may extend into the substrate 100 (e.g., an upper surface of the substrate 100). For example, the protrusion CLp may have a lowermost bottom surface that is lower than the top surface of the substrate 100. The protrusion CLp may be disposed in the vicinity of the second peripheral transistors PTR2 and may be electrically connected to a third impurity region 1c in the substrate 100. The second peripheral transistors PTR2 may be connected through the protrusion CLp to the conductive lines CL. The third impurity region 1c may be a source region or a drain region. The protrusion CLp may be spaced apart from the second peripheral spacer PSP2 (e.g., in the first direction D1). The conductive lines CL may be peripheral circuit lines that are electrically connected to corresponding bit lines BL of the exemplary embodiments of FIGS. 2 and 4A.

The conductive lines CL may each include a barrier pattern 310 and a third conductive pattern 330. The barrier pattern 310 may conformally cover an entire inner surface of the recess RC and a top surface of the second interlayer dielectric layer 195. For example, the barrier pattern 310 may contact lateral surfaces of the first and second interlayer dielectric layers 193, 195 and a surface of the substrate 100 that are exposed by the recess RC. The third conductive pattern 330 may be disposed on the barrier pattern 310 and may completely fill the recess RC. The third conductive pattern 330 on the connection line region CLR may have a top surface at a substantially same level as the top surfaces of the first conductive pads 331 on the decoupling region DCR and the top surfaces of the landing pads LP on the unit cell region UCR.

The separation pattern 350 may be disposed between adjacent conductive lines CL (e.g., in the first direction D1). The separation pattern 350 may surround an outer wall of the conductive line CL. As shown in the exemplary embodiment of FIG. 4C, a portion of the separation pattern 350 may be embedded in the second interlayer dielectric layer 195. For example, a bottom surface of the separation pattern 350 may be disposed between top surfaces of the first and second interlayer dielectric layers 193 and 195. The bottom surface of the separation pattern 350 may be positioned at a level that is lower than a topmost surface of the second interlayer dielectric layer 195. A top surface of the separation pattern 350 may be located at substantially the same level as top surfaces of the conductive lines CL. For example, the top surface of the separation pattern 350 may be coplanar (e.g., in the third direction D3) with the top surface of the conductive lines CL.

A fourth dielectric pattern 410 may be disposed on the conductive lines CL and the separation pattern 350. For example, as shown in the exemplary embodiment of FIG. 4C, lower surfaces of the fourth dielectric pattern 410 may directly contact upper surfaces of the conductive lines CL and the separation pattern 350. Fifth dielectric patterns 430 and second conductive pads 450 may be sequentially disposed on the fourth dielectric pattern 410 (e.g., in the third direction D3). As shown in the exemplary embodiment of FIG. 4C, the second conductive pads 450 may include a plurality of second conductive pads 450 that are spaced apart from each other (e.g., in the first direction D1). The second conductive pads 450 may be called common electrodes. The second conductive pads 450 may be electrically connected to corresponding first conductive pads 331 in the decoupling region DCR. The fifth dielectric patterns 430 may be disposed between the second conductive pads 450 and the fourth dielectric pattern 410 (e.g., in the third direction D3). The second conductive pads 450 may be spaced apart in the third direction D3 from the conductive lines CL. For example, the second conductive pads 450 may be electrically separated from the conductive lines CL. Portions of the fifth dielectric patterns 430 may be embedded in the fourth dielectric pattern 410. For example, as shown in the exemplary embodiment of FIG. 4C, the fifth dielectric patterns 430 may each have a bottom surface 430b at a lower level than a top surface 410t of the fourth dielectric pattern 410. In an exemplary embodiment, the fifth dielectric patterns 430 may include silicon nitride. The second conductive pads 450 may have lateral sidewalls that are correspondingly aligned with lateral sidewalls of the fifth dielectric patterns 430. The second conductive pads 450 may include metal. For example, the second conductive pads 450 may include tungsten (W).

Third bottom electrodes BE3 may be disposed on the second conductive pads 450. In an exemplary embodiment, the third bottom electrodes BE3 may be formed of substantially the same material in substantially the same process used for forming the second part BE1b of each of the first bottom electrodes BE1 on the unit cell region UCR and for forming the second part BE2b of each of the second bottom electrodes BE2 on the decoupling region DCR. A plurality of third bottom electrodes BE3 may be disposed on each of the second conductive pads 450. For example, a plurality of third bottom electrodes BE3 may be connected in common to one of the second conductive pads 450. The third bottom electrodes BE3 may extend in the third direction D3 from the second conductive pads 450. For example, as shown in the exemplary embodiment of FIG. 4C, portions of the third bottom electrodes BE3 may be embedded in the second conductive pads 450. The third bottom electrodes BE3 may each have a bottom surface BE3b at a lower level than the level of a top surface 450t of each of the second conductive pads 450. In addition, the bottom surface BE3b of each of the third bottom electrodes BE3 may be located at a higher level than the bottom-electrode boundary BEB on the unit cell region UCR and the decoupling region DCR. For example, in other exemplary embodiments, the bottom surface BE3b of each of the third bottom electrodes BE3 may be located at a lower level than the bottom-electrode boundary BEB on the unit cell region UCR and the decoupling region DCR. A height in the third direction D3 of the third bottom electrode BE3 may be less than the height in the third direction D3 of the first bottom electrode BE1 on the unit cell region UCR and less than the height in the third direction D3 of the second bottom electrode BE2 on the decoupling region DCR. The height in the third direction D3 of the third bottom electrode BE3 may be about half the height in the third direction D3 of each of the first and second bottom electrodes BE1 and BE2. The third bottom electrodes BE3 may have their top surfaces BE3t at substantially the same level as the top surfaces BE1t of the first bottom electrodes BE1 on the unit cell region UCR and the top surfaces BE2t of the second bottom electrodes BE2 on the decoupling region DCR.

A third dielectric layer DL3 and a third top electrode TE3 may be sequentially disposed on the third bottom electrodes BE3. The third top electrode TE3 may be electrically connected to the second top electrode TE2 on the decoupling region DCR. Therefore, a substantially single capacitor may be constituted by the second capacitor CAP2 on the decoupling region DCR and a third capacitor CAP3 which will be discussed below. In an exemplary embodiment, the third dielectric layer DL3 may be formed of the same material in the same process used for forming the first dielectric layer DL1 on the unit cell region UCR and for forming the second dielectric layer DL2 on the decoupling region DCR. The third top electrode TE3 may be formed of the same material in the same process used for forming the first top electrode TE1 on the unit cell region UCR and for forming the second top electrode TE2 on the decoupling region DCR. The third bottom electrodes BE3, the third dielectric layer DL3, and the third top electrode TE3 may constitute third capacitors CAP3. The third capacitor CAP3 on the connection line region CLR may be called a decoupling capacitor or a power capacitor. The second capacitor CAP2 may be disposed in the decoupling region DCR, and the third capacitor CAP3 may be disposed in the connection line region CLR, with the result that the semiconductor device may increase in overall decoupling capacitance. Therefore, it may be easy to remove noise between operating powers. According to the present inventive concepts, since the second conductive pads 450 are electrically separated from the conductive lines CL across the fifth dielectric patterns 430, it may be possible to securely establish a space in which the third capacitor CAP3 is provided.

The upper dielectric layer 650 in the connection line regions CLR may directly contact top surfaces and lateral sidewall surfaces of the second conductive layer 630, top surfaces and lateral side surfaces of the second conductive pads 450, lateral side surfaces of the fifth dielectric pattern 430 and a top surface of the fourth dielectric pattern 410. Second contact plugs MC2 may extend in the third direction D3 and may penetrate the upper dielectric layer 650 in the vicinity of the third top electrode TE3. The second contact plugs MC2 may be electrically connected to corresponding second conductive pads 450. The second conductive pads 450 may be connected in parallel to each other through the second contact plugs MC2, and thus decoupling capacitance may increase. The second conductive layer 630 of the third top electrode TE may be disposed between the fifth dielectric patterns 430 and the second conductive pads 450 (e.g., in the first direction D1). While the exemplary embodiment shown in FIG. 4C includes a bottom surface of the second contact plugs MC2 directly contacting a top surface of the second conductive pads 450, exemplary embodiments of the present inventive concepts are not limited thereto. For example, in other exemplary embodiments, portions of the second contact plugs MC2 may be embedded in the second conductive pads 450. For example, the second contact plugs MC2 may extend within the second conductive pads 450 and may have bottom surfaces at a lower level than top surfaces 450t of each of the second conductive pads 450.

A cross-sectional structure of the connection line region CLR shown in FIG. 4C may be substantially the same as that of the core region COR shown in FIG. 1. For example, according to an exemplary embodiment of the present inventive concepts, the core region COR may also be provided with a decoupling capacitor such as the third capacitor CAP3.

FIGS. 5A to 11A illustrate cross-sectional views taken along line I-I' of FIG. 2, showing a method of fabricating a cell array region of a semiconductor device according to exemplary embodiments of the present inventive concepts. FIGS. 5B to 11B illustrate cross-sectional views taken along line II-II' of FIG. 3, showing a method of fabricating a decoupling region of a peripheral circuit region of a semiconductor device according to exemplary embodiments of the present inventive concepts. FIGS. 5C to 11C illustrate cross-sectional views taken along line III-III' of FIG. 3, showing a method of fabricating a connection line region of a peripheral circuit region of a semiconductor device according to exemplary embodiments of the present inventive concepts.

The following will discuss a method of fabricating a semiconductor device according to some exemplary embodiments of the present inventive concepts with reference to FIGS. 4A to 4C and 5A to 11C.

Figure 5A:
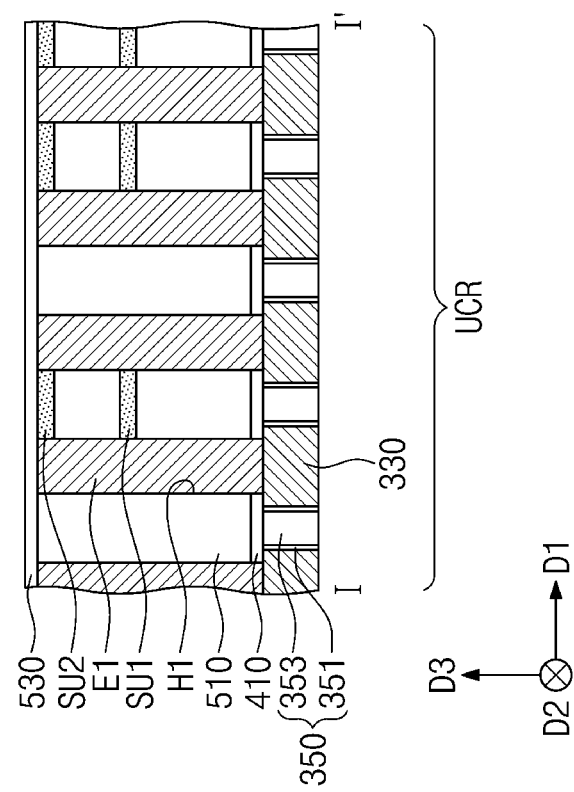
Figure 5B:
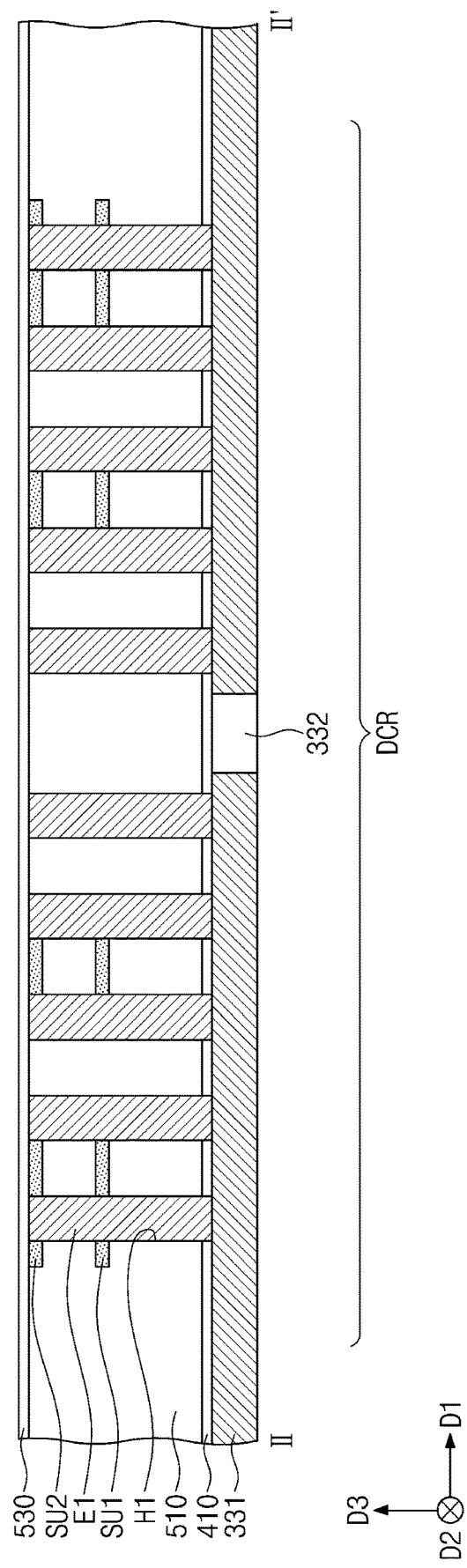

Referring to the exemplary embodiments of FIGS. 5A, 5B, and 5C, first electrodes E1 may be thrilled on the unit cell region UCR and the decoupling region DCR. The first electrodes E1 may be formed on corresponding landing pads (see LP of FIG. 4A) on the unit cell region UCR and on corresponding first conductive pads 331 on the decoupling region DCR. First and second support patterns SU1 and SU2 may be formed to connect sidewalls of adjacent first electrodes E1. A first sacrificial layer 510 may be formed to fill spaces between the adjacent first electrodes E1 (e.g., in the first direction D1) and between adjacent first and second support patterns SU1 and SU2 (e.g., in the third direction D3). In an exemplary embodiment, the first sacrificial layer 510 may include silicon oxide. However, exemplary embodiments of the present inventive concepts are not limited thereto. An etch stop layer 530 may be formed on top surfaces of the first electrodes E1 and on top surfaces of the second support patterns SU2. In an exemplary embodiment, the etch stop layer 530 may include silicon nitride. However, exemplary embodiments of the present inventive concepts are not limited thereto.

In an exemplary embodiment, the formation of the first electrodes E1 may include forming dielectric layers that extend in the first direction D1 within the first sacrificial layer 510, etching the first sacrificial layer 510 and the dielectric layers to form first holes H1 that expose the landing pads LP or the first conductive pads 331, and filling the first holes H1 with a conductive material. In contrast, the first holes H1 may not be formed on the connection line region CLR. Therefore, the first electrodes E1 may not be formed on the connection line region CLR. While the first holes H1 shown in the exemplary embodiment of FIGS. 5A and 5B have opposing sidewalls that are parallel to each other and the first holes H1 have a constant width (e.g., length in the first direction D1), exemplary embodiments of the present inventive concepts are not limited thereto. For example, in other exemplary embodiments, the first holes H1 may each have a width that increases along the third direction D3.

In an exemplary embodiment, the formation of the first and second support patterns SU1 and SU2 may include partially etching regions between the first electrodes E1 to remove portions of the dielectric layers and portions of the first sacrificial layer 510, and then filling empty spaces, where the dielectric layers and the first sacrificial layer 510 are partially removed, with the same material as that of the first sacrificial layer 510.

Figure 6B:
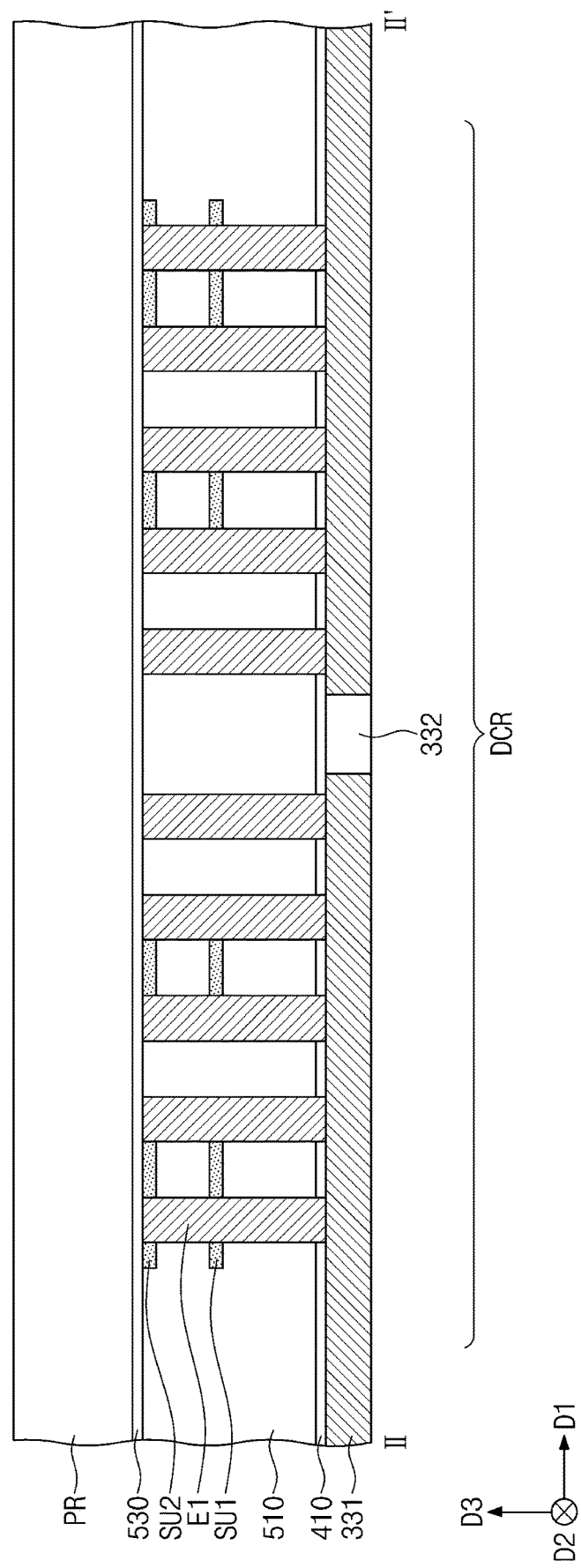
Figure 6C:
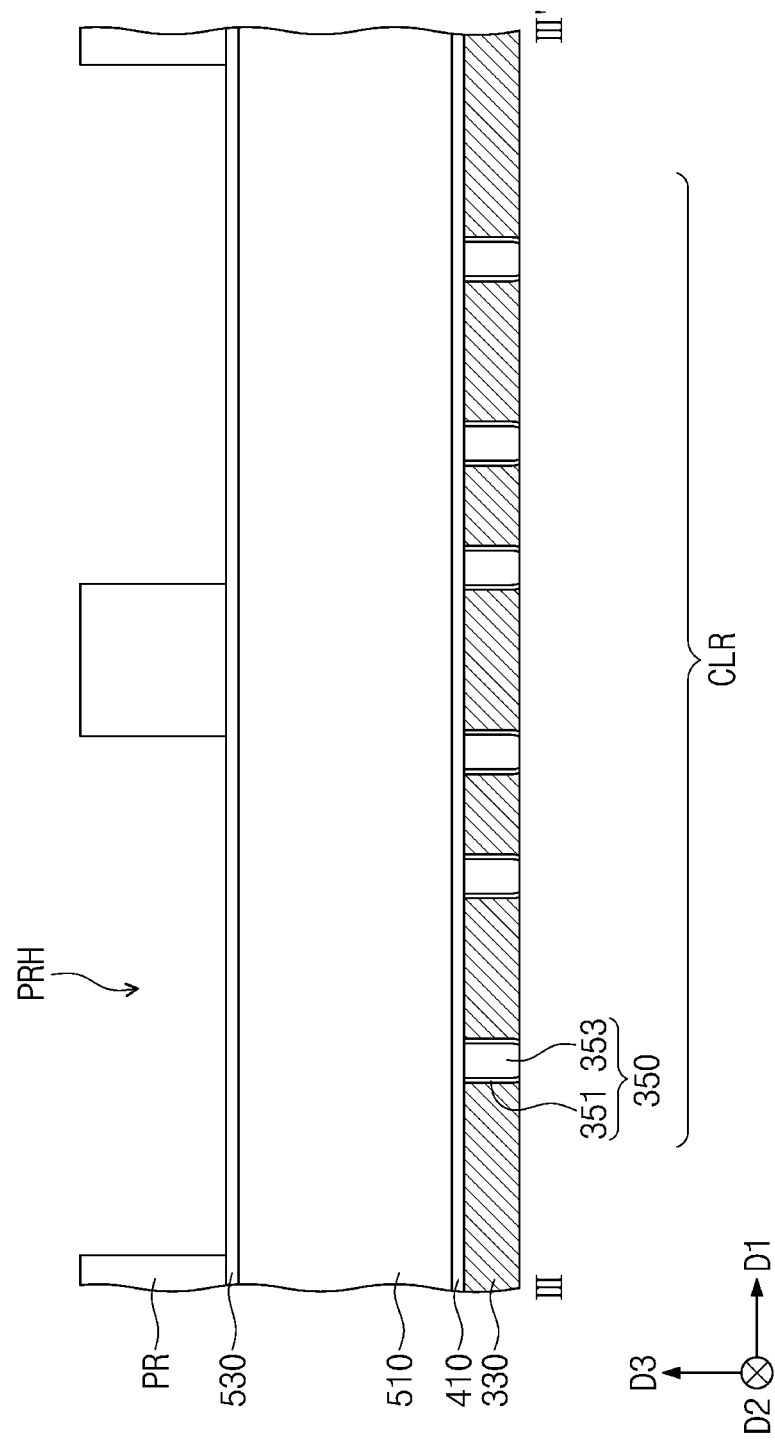

Referring to the exemplary embodiments of FIGS. 6A, 6B, and 6C, a photoresist PR may be formed on the etch stop layer 530 on the unit cell region UCR, the decoupling region DCR, and the connection line region CLR. As shown in the exemplary embodiment of FIG. 6C, the photoresist PR may include photoresist openings PRH on the connection line region CLR. The photoresist PR may be removed after a photolithography process.

Figure 7A:
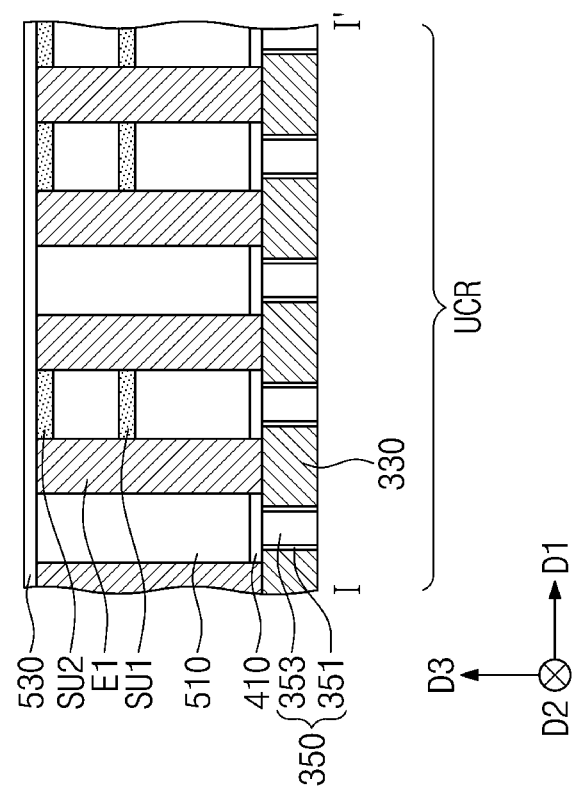
Figure 7B:
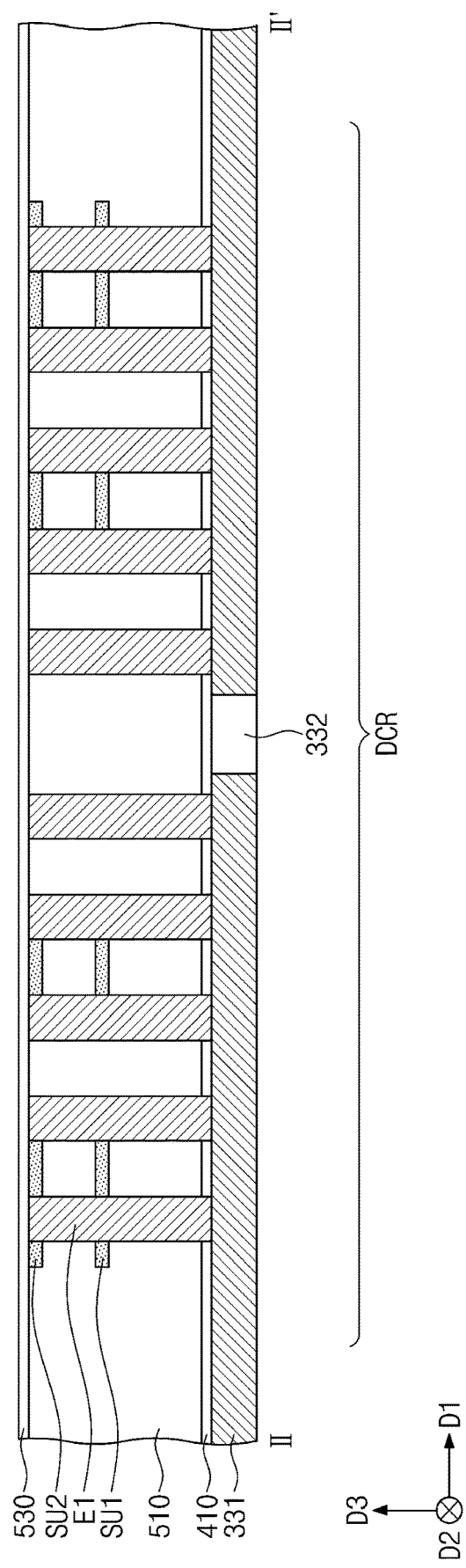
Figure 7C:
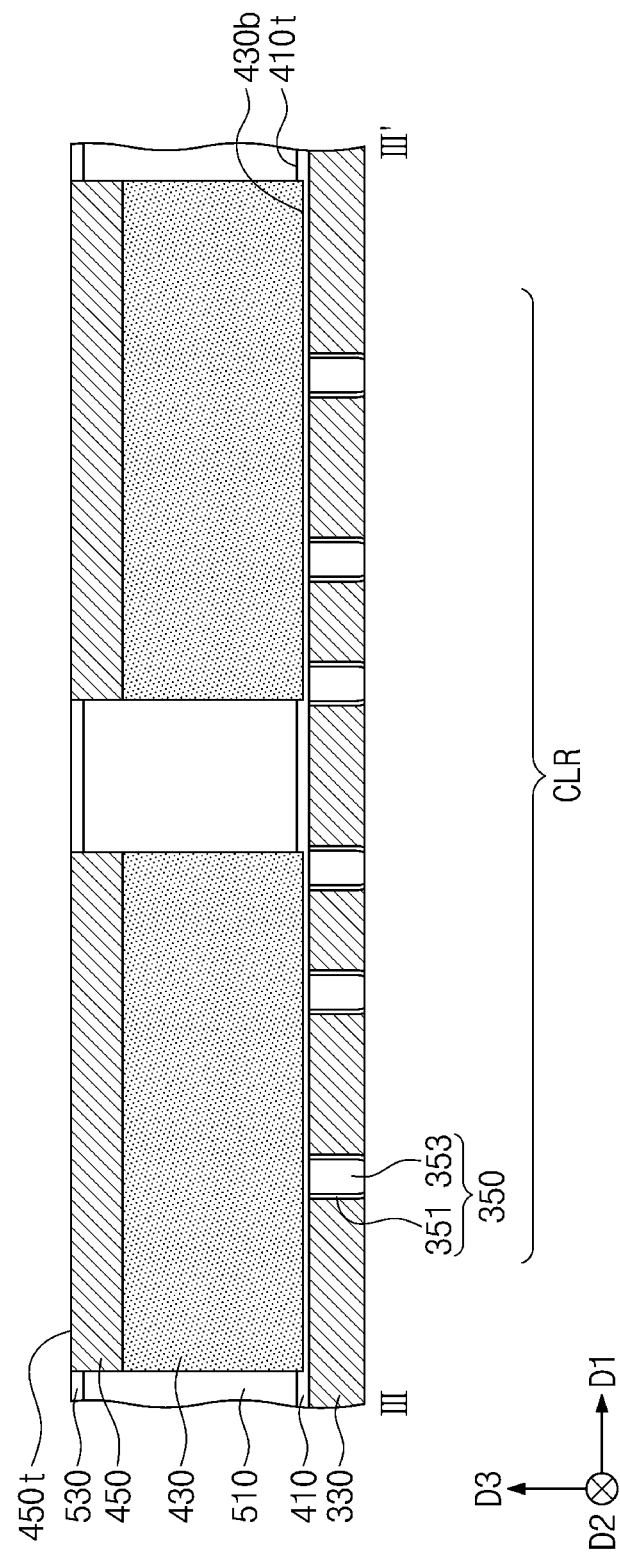

Referring to the exemplary embodiments of FIGS. 7A, 7B, and 7C, a photolithography process may be performed to partially etch the first sacrificial layer 510 on the connection line region CLR. For example, when the first sacrificial layer 510 is etched, the fourth dielectric pattern 410 may also be partially etched. Therefore, a bottom surface 430b of each of fifth dielectric patterns 430, which will be subsequently formed, may be located at a lower level than the top surface 410t of the fourth dielectric pattern 410. However, a top surface of the third conductive pattern 330 may not be exposed even after the etching process. Fifth dielectric patterns 430 and second conductive pads 450 may be formed in empty spaces where the first sacrificial layer 510 is partially etched. For example, as shown in the exemplary embodiment of FIG. 7C, the fifth dielectric patterns 430 and the second conductive pads 450 may be consecutively stacked on each other (e.g., in the third direction D3). The fifth dielectric patterns 430 and the second conductive pads 450 may completely fill the empty spaces formed by the etching of the first sacrificial layer 510. Therefore, a top surface 450t of each of the second conductive pads 450 may be coplanar with a top surface of the etch stop layer 530. For example, the bottom surfaces of the second conductive pads 450 may be positioned at a lower level than a bottom surface of the etch stop layer 530.

Figure 8A:
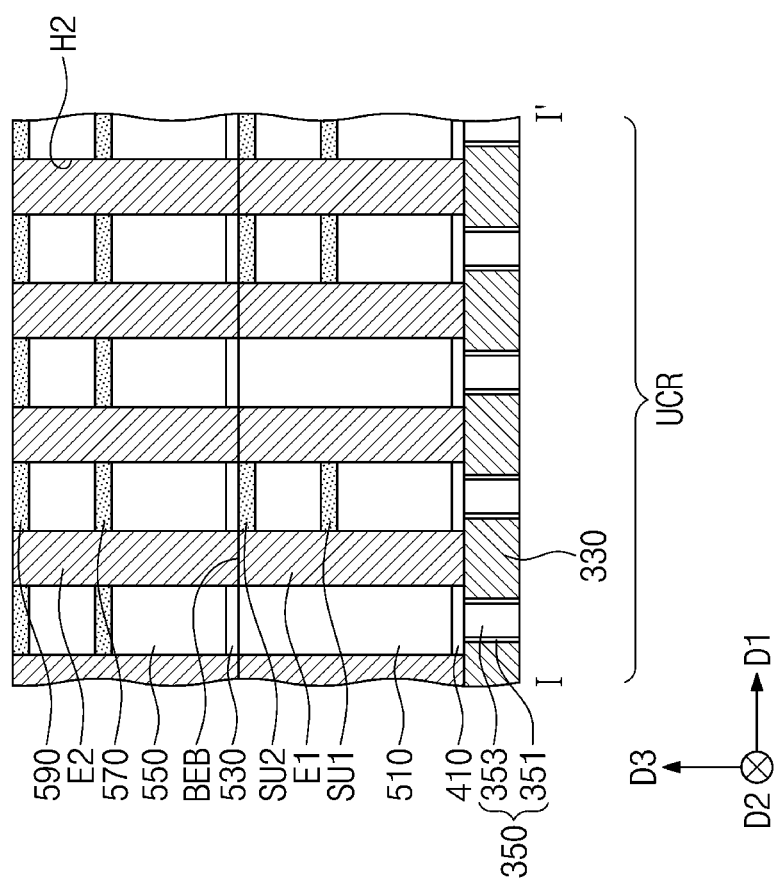
Figure 8B:
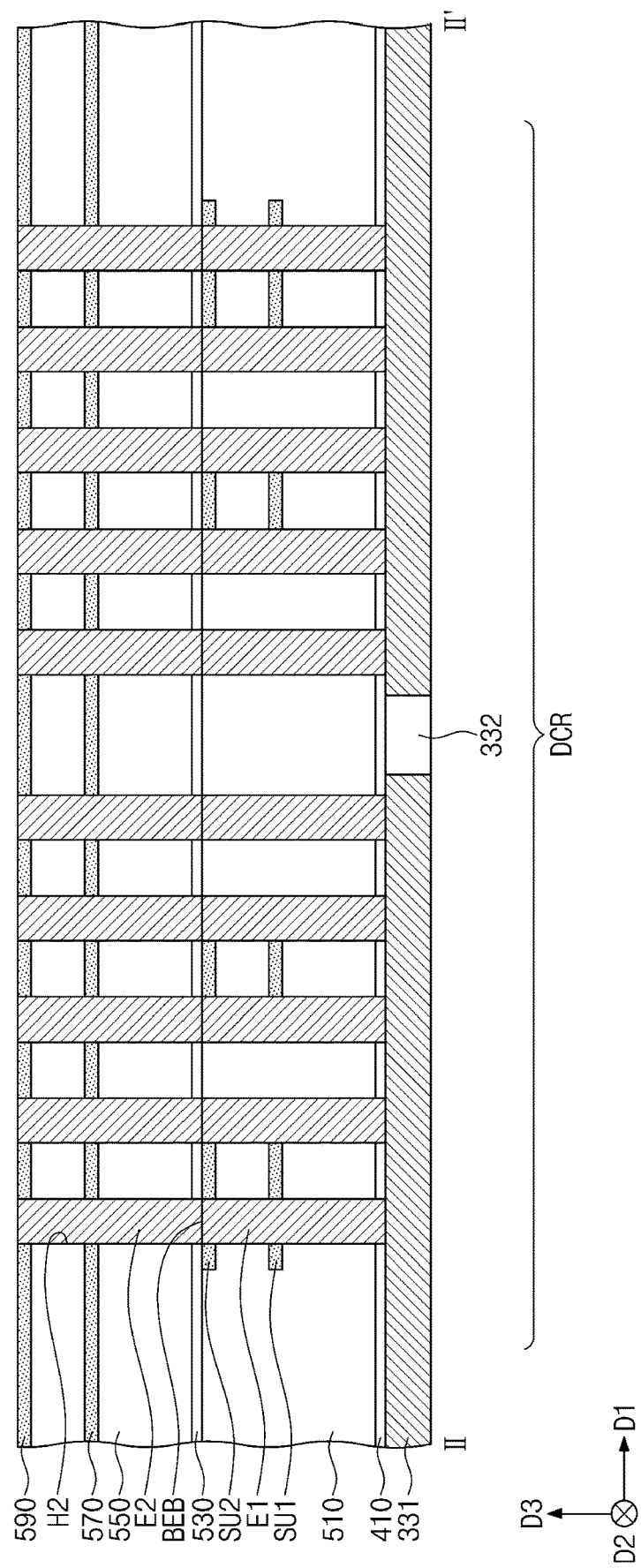
Figure 8C:
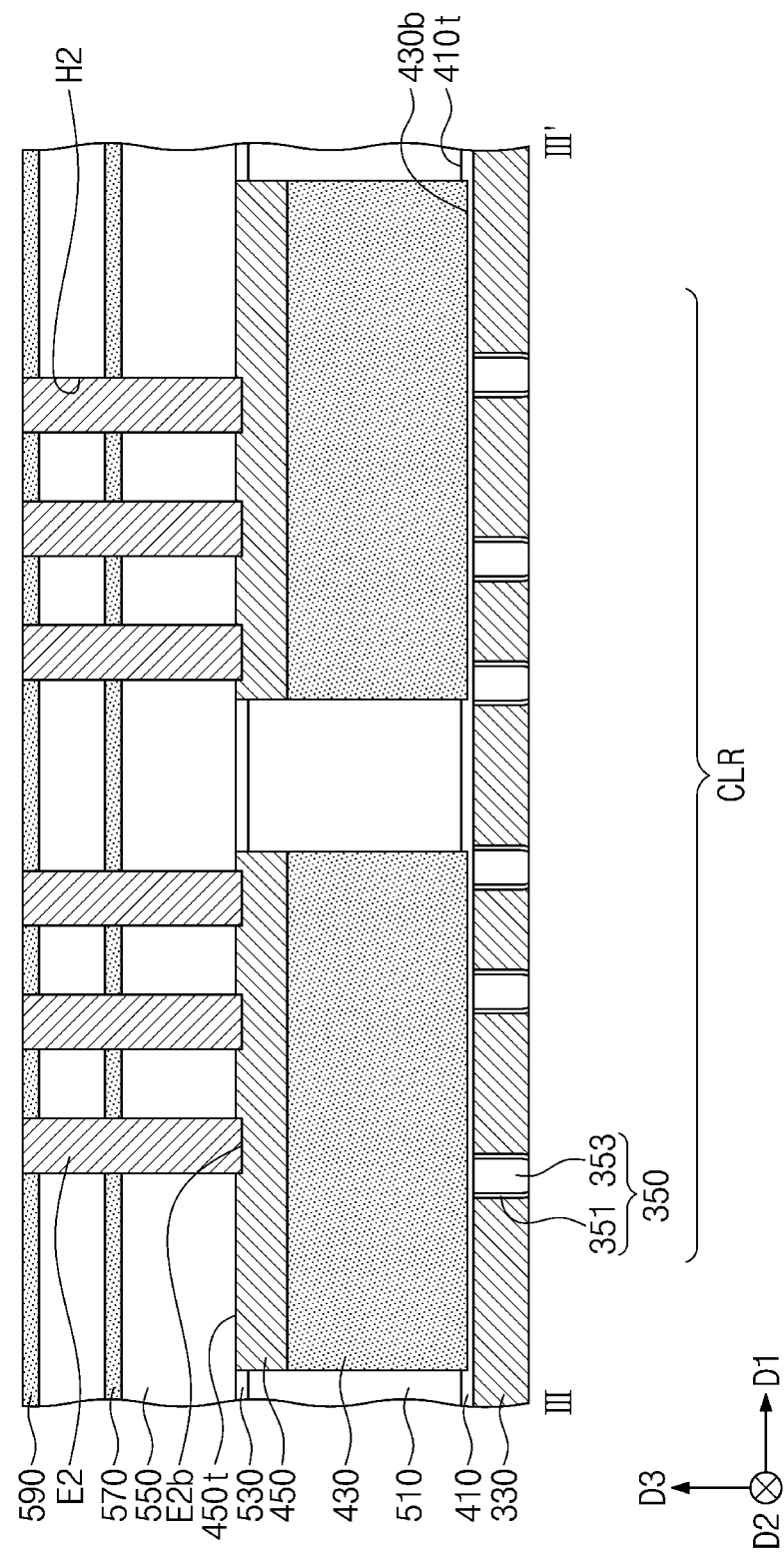

Referring to the exemplary embodiments of FIGS. 8A, 8B, and 8C, on the unit cell region UCR and the decoupling region DCR, a second sacrificial layer 550 may be formed on the first sacrificial layer 510 having the first electrodes E1 disposed therebetween. The second sacrificial layer 550 may have second electrodes E2, a first support dielectric layer 570, and a second support dielectric layer 590 formed therein. On the connection line region CLR, the second sacrificial layer 550 may also be formed on the first sacrificial layer 510 and the second conductive pads 450. The second sacrificial layer 550 on the connection line region CLR may also have second electrodes E2, the first support dielectric layer 570, and the second support dielectric layer 590 formed therein. The second sacrificial layer 550 may fill spaces between the second electrodes E2 (e.g., in the first direction D1) and between the first and second support dielectric layers 570 and 590 (e.g., in the third direction D3). In an exemplary embodiment, the second sacrificial layer 550 may include silicon oxide. However, exemplary embodiments of the present inventive concepts are not limited thereto.

The formation of the second electrodes E2 may include sequentially depositing the second sacrificial layer 550, the first support dielectric layer 570, and the second support dielectric layer 590 (e.g., in the third direction D3), partially etching the second sacrificial layer 550 and the first and second support dielectric layers 570 and 590 to form second holes H2 that expose the first electrodes E1 or the second conductive pads 450, and then filing the second holes H2 with a conductive material. While the exemplary embodiments of FIGS. 8A-8C include the second holes H2 having opposing sidewalls that are parallel to each other and the second holes H2 have a constant width (e.g., length in the first direction D1), exemplary embodiments of the present inventive concepts are not limited thereto. For example, in other exemplary embodiments, the second holes H2 may each have a width that increases along the third direction D3.

When the second holes H2 are formed, the etch stop layer 530 may further be etched on the unit cell region UCR and the decoupling region DCR, and the second conductive pads 450 may further be partially etched on the connection line region CLR. Therefore, the first electrodes E1 may be in contact with the second electrodes E2 on the unit cell region UCR and the decoupling region DCR. On the connection line region CLR, the bottom surfaces E2b of the second electrodes E2 may be located at a lower level than the top surface 450t of each of the second conductive pads 450. For example, as shown in the exemplary embodiment of FIG. 8C, the bottom surfaces E2b of the second electrodes E2 may be imbedded in the second conductive pads 450.

Figure 9A:
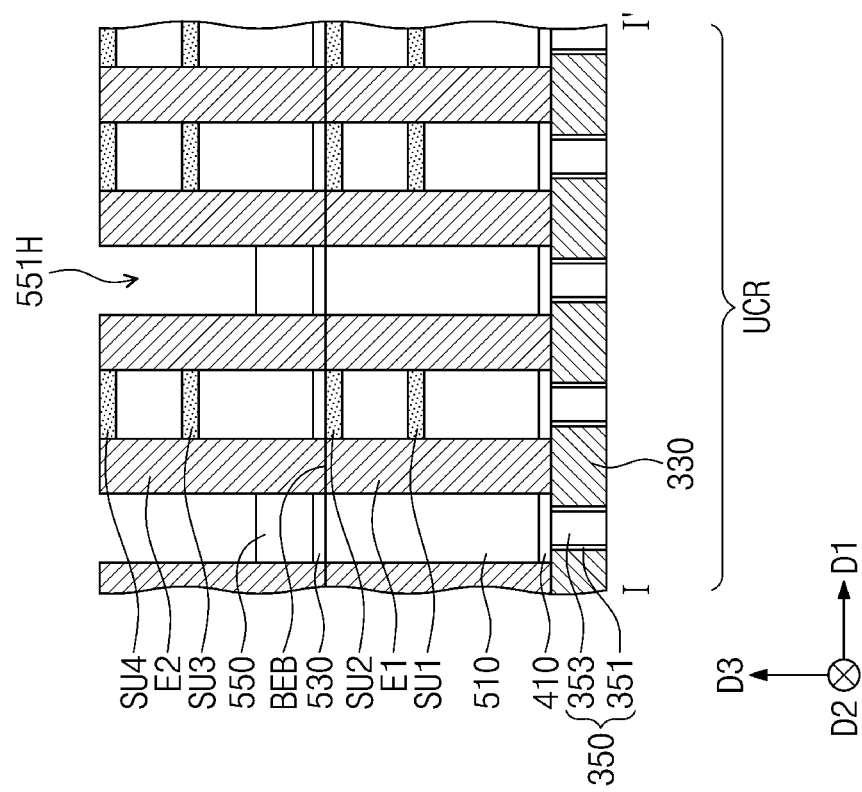
Figure 9B:
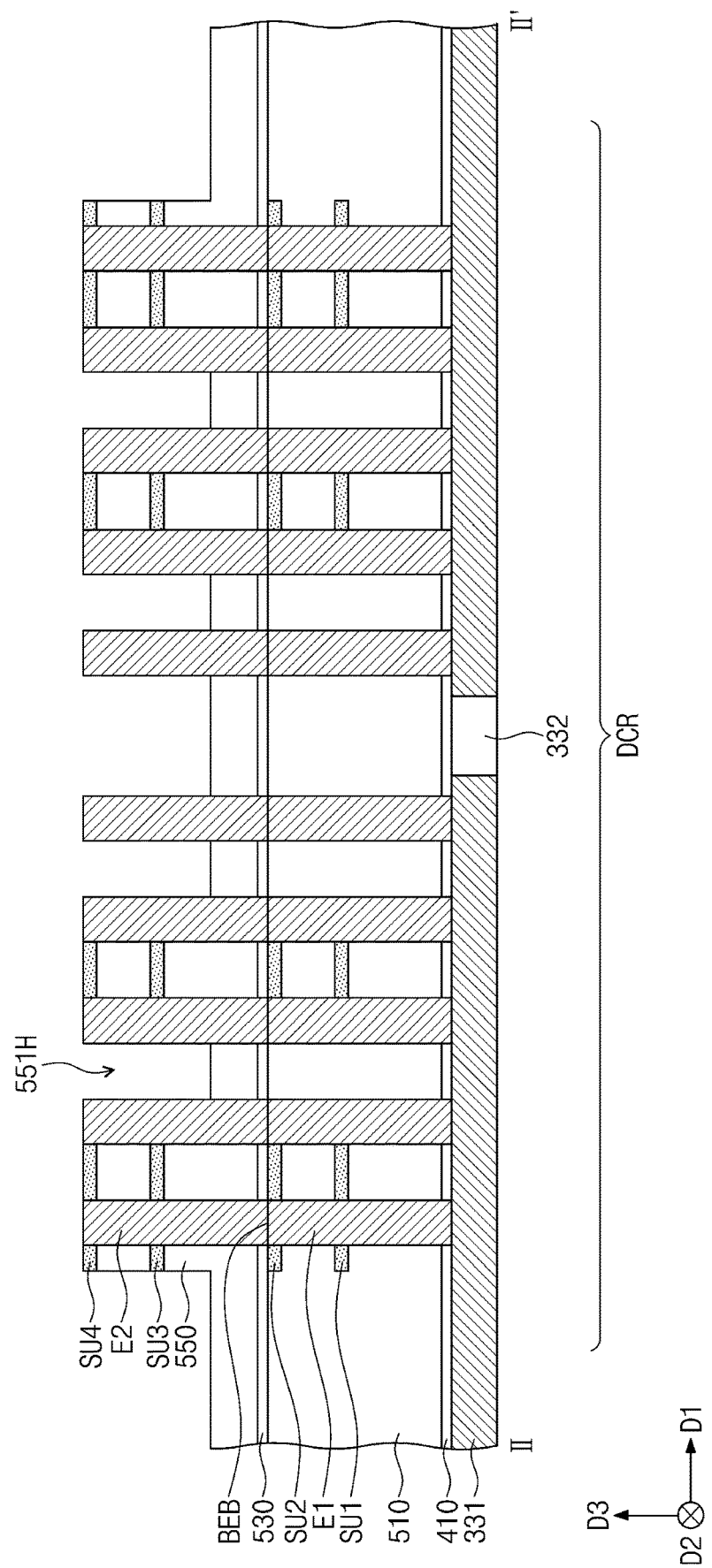
Figure 9C:
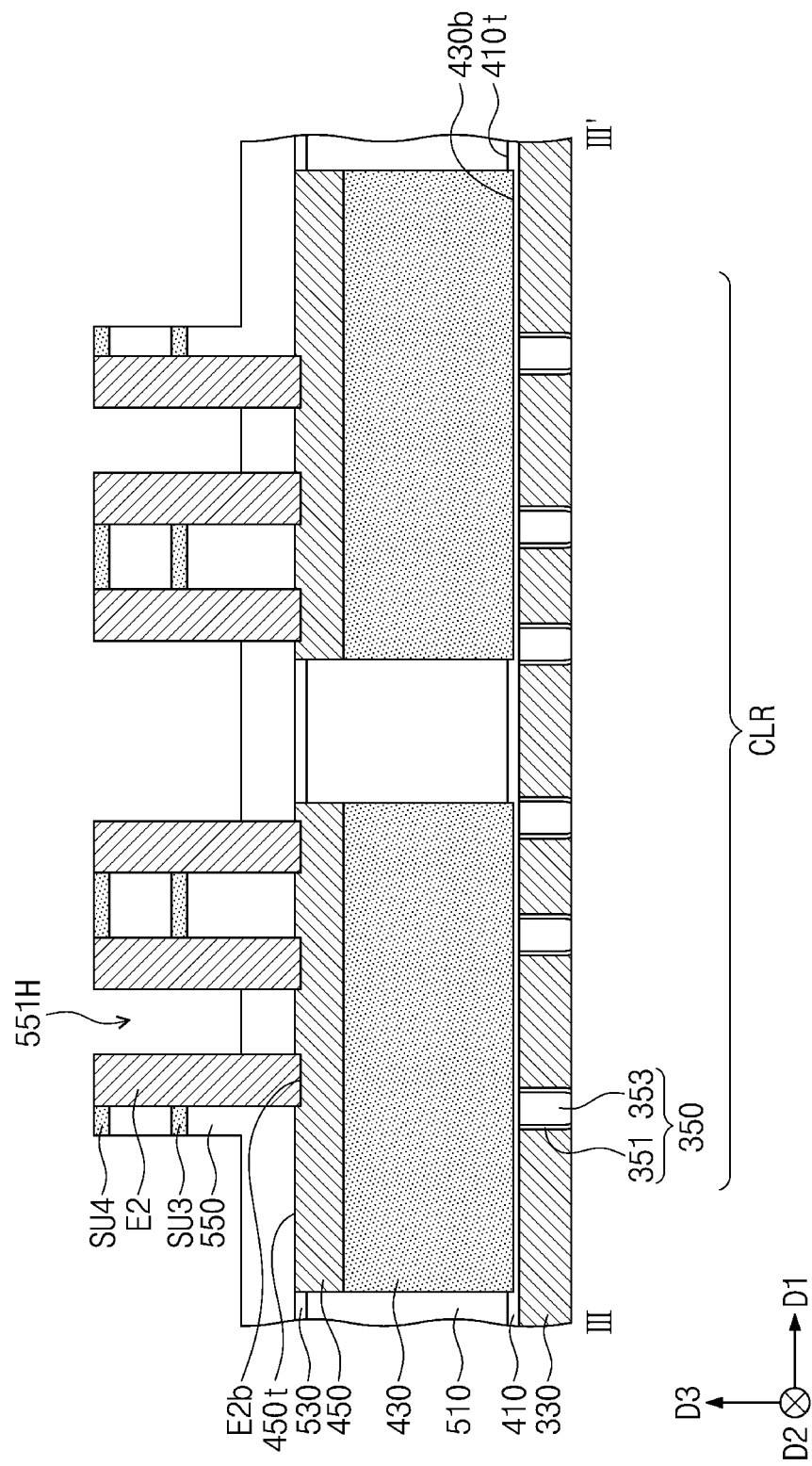

Referring to the exemplary embodiments of FIGS. 9A, 9B, and 9C, the second sacrificial layer 550 may be partially etched to form third and fourth support patterns SU3 and SU4. The partial etching of the second sacrificial layer 550 may be performed in a manner that does not expose the top surface of the etch stop layer 530. When the second sacrificial layer 550 is partially etched, upper openings 551H may be formed to partially expose sidewalls of the second electrodes E2. The third and fourth support patterns SU3 and SU4 may connect the lateral sidewalls of adjacent second electrodes E2.

Figure 10A:
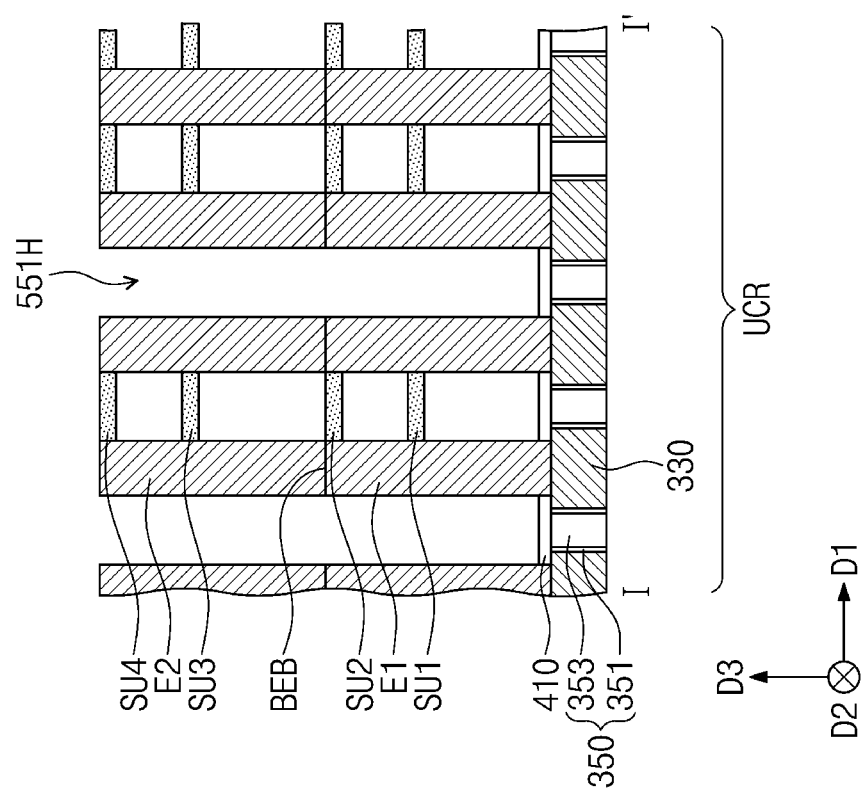
Figure 10B:
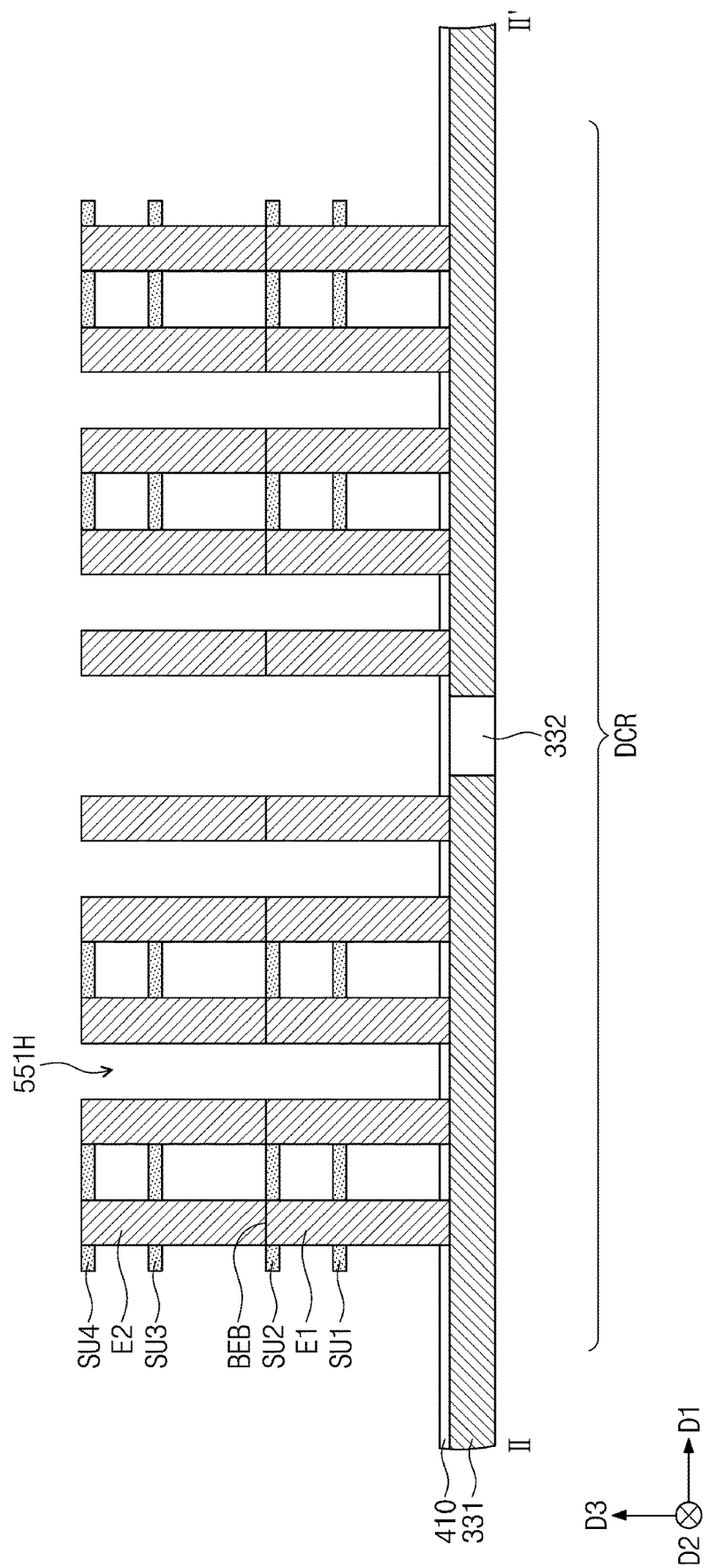
Figure 10C:
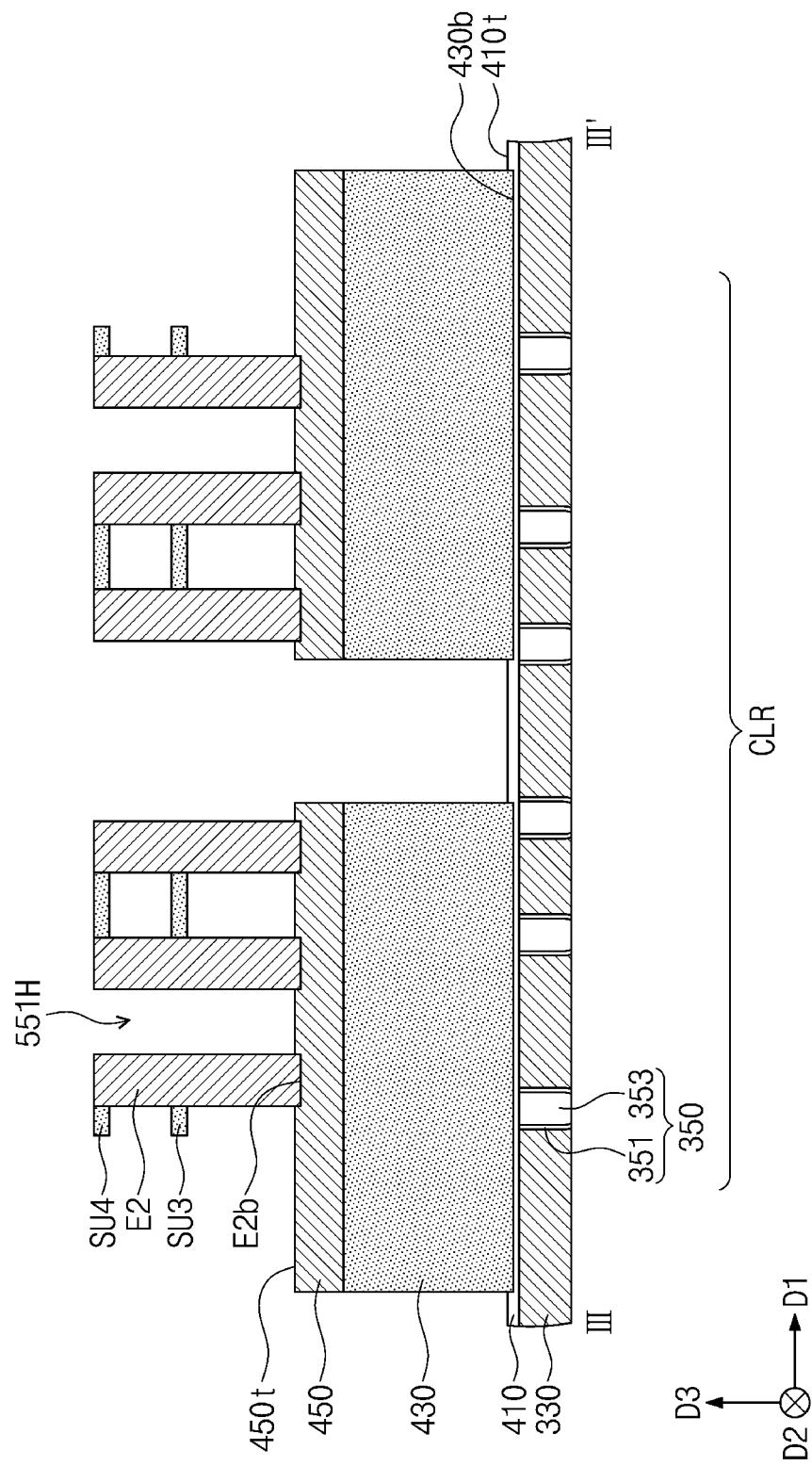

Referring to the exemplary embodiments of FIGS. 10A, 10B, and 10C, the upper openings 551H may be introduced therein with a wet etching solution to remove the first and second sacrificial layers 510 and 550 and the etch stop layer 530. However, the fourth dielectric pattern 410, the fifth dielectric patterns 430, and the second conductive pads 450 may not be removed during the introduction of the wet etching solution. In an exemplary embodiment, the wet etching solution may be, for example, a hydrofluoric acid (HF) solution or a buffered HF solution such as a LAL solution. However, exemplary embodiments of the present inventive concepts are not limited thereto.

The removal of the first and second sacrificial layers 510 and 550 and the etch stop layer 530 may externally expose the lateral sidewalls of the first and second electrodes E1 and E2, the top and bottom surfaces of the first to fourth support patterns SU1 to SU4, and the top surface 410t of the fourth dielectric pattern 410. In addition, the removal of the first and second sacrificial layers 510 and 550 and the etch stop layer 530 on the connection line region CLR may expose the top surfaces 450t of the second conductive pads 450, and the lateral sidewalls of the fifth dielectric patterns 430 and the second conductive pads 450 may also be externally exposed.

Figure 11A:
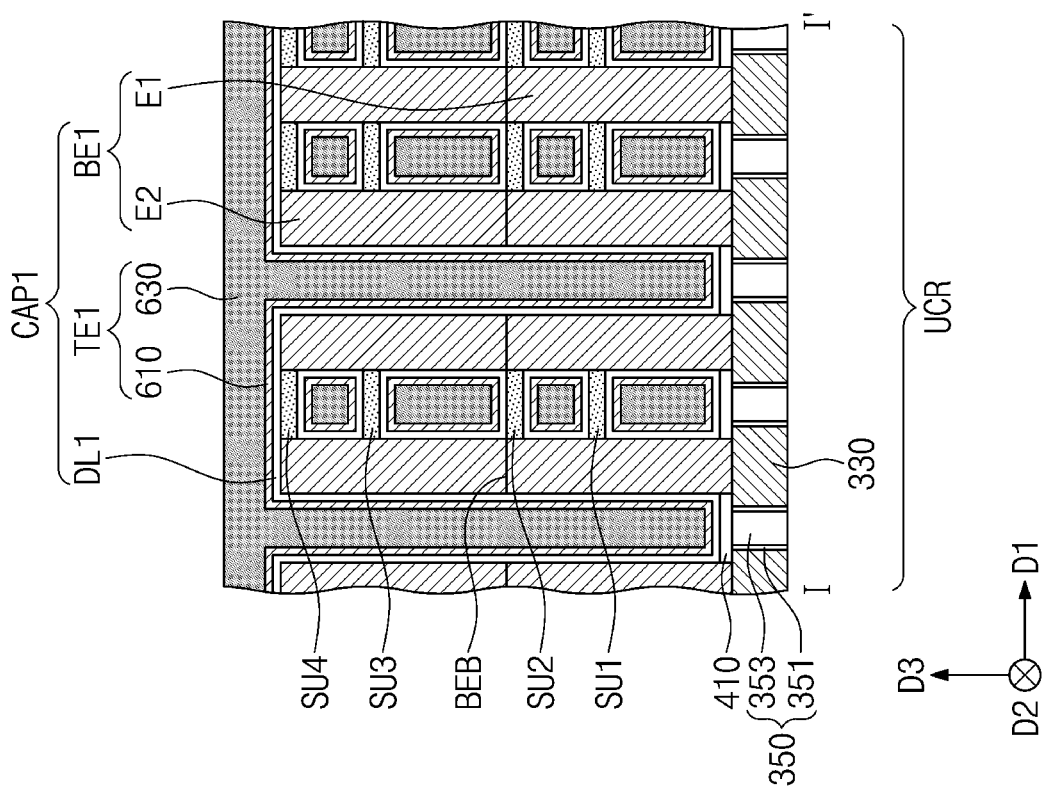
Figure 11C:
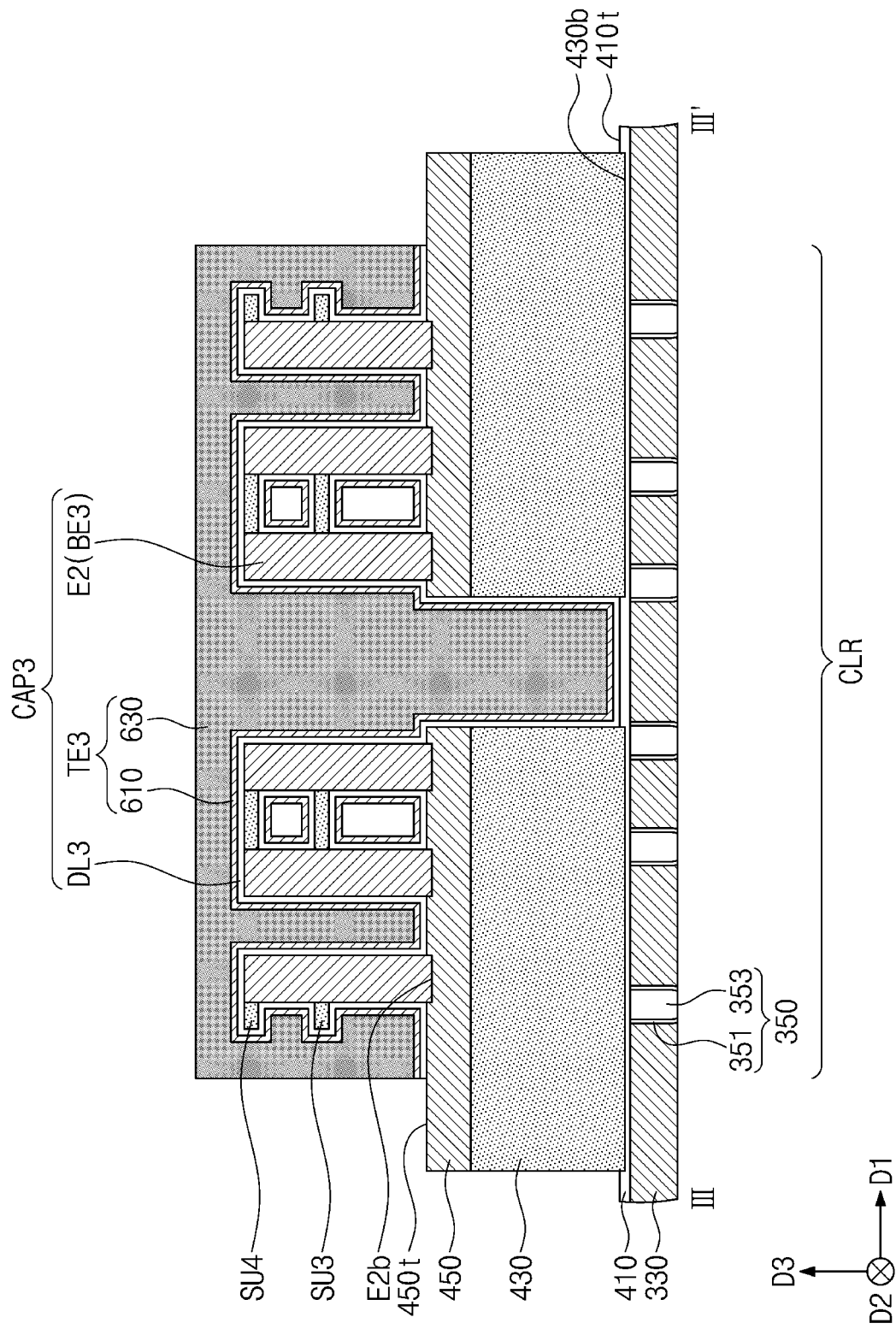

Referring to the exemplary embodiments of FIGS. 11A, 11B, and 11C, a first dielectric layer DL1, a second dielectric layer DL2, and a third dielectric layer DL3 may be formed in the unit cell regions UCR, decoupling regions DCR and the connection line regions CLR, respectively, to conformally cover the first electrodes E1 and the second electrodes E2. On the connection line region CLR, the third dielectric layer DL3 may conformally cover lateral sidewalls of the second conductive pads 450 and lateral sidewalls of the fifth dielectric patterns 430. For example, as shown in the exemplary embodiment of FIG. 11C, the third dielectric layer DL3 may cover inner lateral sidewalls of the second conductive pads 450 and the fifth dielectric patterns 430. In addition, a first conductive layer 610 may be formed to conformally cover the first dielectric layer DL1, the second dielectric layer DL2 and the third dielectric layer DL3. A second conductive layer 630 may be formed on the first conductive layer 610 to thereby fill spaces between the first electrodes E1 and between the second electrodes E2. On the connection line region CLR, the second conductive layer 630 may be formed not only be disposed between the first electrodes E1 and between the second electrodes E2, but also to fill spaces between the second conductive pads 450 and between the fifth dielectric patterns 430. As shown in the exemplary embodiment of FIG. 11C, the third dielectric layer DL3 may not cover the entire top surface of the second conductive pads 450 and the outer lateral edge of the third dielectric layer DL3 may be aligned with the outer lateral edges of the first conductive layer 610 and the second conductive layer 630. In an exemplary embodiment, the first conductive layer 610 and the second conductive layer 630 may be formed by a chemical vapor deposition (CVD) process. An ion implantation process may be performed to dope impurities into the second conductive layer 630. For example, the ion implantation process on the second conductive layer 630 may be performed simultaneously with the deposition process. However, exemplary embodiments of the present inventive concepts are not limited thereto.

Referring back to the exemplary embodiments of FIGS. 4A, 4B, and 4C, an upper dielectric layer 650 may be formed to cover the second conductive layer 630. In addition, on the decoupling region DCR and the connection line region CLR, the upper dielectric layer 650 may be partially etched to form empty spaces and then the empty spaces may be filled with a conductive material to form first contact plugs MC1 and second contact plugs MC2, respectively. The partial etching of the upper dielectric layer 650 may continue until the first conductive pads 331 or the second conductive pads 450 are exposed. However, exemplary embodiments of the present inventive concepts are not limited thereto. For example, in another exemplary embodiment, when the upper dielectric layer 650 is etched, the first conductive pads 331 or the second conductive pads 450 may also be partially etched.

According to exemplary embodiments of the present inventive concepts, a semiconductor device may include a decoupling capacitor on both a decoupling region and a connection line region, and thus the decoupling capacitance may increase and noise between operating powers may be easily removed.

Furthermore, on the connection line region, conductive pads may be electrically separated from conductive lines across dielectric patterns, and thus it may be possible to securely establish a space in which the decoupling capacitor is disposed.

Although exemplary embodiments of the present inventive concepts have been described and illustrated in the accompanying drawings, it will be understood by one of ordinary skill in the art that variations in form and detail may be made therein without departing from the spirit and essential feature of the present inventive concepts. Therefore, the above disclosed exemplary embodiments should thus be considered illustrative and not restrictive and the present inventive concepts are not limited thereby.

What is claimed is:

1. A semiconductor device, comprising
a substrate including a cell array region and a peripheral circuit region that surrounds the cell array region,
wherein the cell array region includes:
a plurality of landing pads disposed on the substrate; and
a plurality of first bottom electrodes disposed on and connected to corresponding landing pads;
wherein the peripheral circuit region includes:
a plurality of conductive lines disposed on the substrate;
a first conductive pad disposed on and spaced apart from the conductive lines;
a dielectric pattern disposed between the conductive lines and the first conductive pad; and
a plurality of second bottom electrodes disposed on and connected in common to the first conductive pad,
wherein a height between an uppermost surface and a lowermost surface of each of the first bottom electrodes is greater than a height bet an uppermost surface and a lowermost surface of each of the second bottom electrodes, and
wherein top surfaces of the first bottom electrodes are located at a same level as a level of top surfaces of the second bottom electrodes.

2. The semiconductor device of claim 1, wherein the first bottom electrodes include:
a plurality of first parts disposed on and connected to corresponding landing pads; and
a plurality of second parts disposed on the plurality of first parts,
wherein the second bottom electrodes are located at a level that is higher than a level of a bottom-electrode boundary positioned at a boundary between the plurality of first parts and the plurality of second parts.

3. The semiconductor device of claim 2, further comprising:
a plurality of first support patterns that are configured to connect adjacent first parts to each other; and
a plurality of second support patterns that are configured to connect adjacent second parts to each other,
wherein the plurality of first support patterns vertically overlap the plurality of second support patterns.

4. The semiconductor device of claim 1, wherein top surfaces of the conductive lines are located at a same level as a level of top surfaces of the landing pads.

5. The semiconductor device of claim 1, wherein the height of each of the first bottom electrodes is in a range of about 1,600 nm to about 2,400 nm.

6. The semiconductor device of claim 1, wherein the dielectric pattern includes silicon nitride.

7. The semiconductor device of claim 1, wherein a lateral sidewall of the dielectric pattern is aligned with a lateral sidewall of the first conductive pad.

8. The semiconductor device of claim 1, wherein:
the first conductive pad includes a plurality first conductive pads that are spaced apart from each other;
wherein each of the plurality of first conductive pads is connected in common to the plurality of second bottom electrodes, and
wherein the plurality of first conductive pads are connected in parallel to each other.

9. The semiconductor device of claim 1, wherein
the peripheral circuit region includes a first region and a second region that surrounds the first region,
the conductive lines, the first conductive pad, and the second bottom electrodes are disposed in the second region,
the first region includes:
a second conductive pad disposed on the substrate; and
a plurality of third bottom electrodes disposed on and connected in common to the second conductive pad, and
a height between an uppermost surface and a lowermost surface of each of the third bottom electrodes and the height of each of the first bottom electrodes are equal to each other.

10. The semiconductor device of claim 9, wherein a top surface of the second conductive pad is located at a same level as a level of top surfaces of the conductive lines and the landing pads.

11. A semiconductor device, comprising:
a substrate including a cell array region and a peripheral circuit region that surrounds the cell array region;
a plurality of conductive lines disposed on the substrate in the peripheral circuit region;
a plurality of conductive pads disposed on and spaced apart from the plurality of conductive lines, the plurality of conductive pads are spaced apart from each other;
a plurality of dielectric patterns disposed between the plurality of conductive lines and the plurality of conductive pads, the plurality of dielectric patterns are spaced apart from each other;
a plurality of bottom electrodes disposed on the plurality of conductive pads, each of the plurality of bottom electrodes are connected in common to one conductive pad of the plurality of conductive pads;
a dielectric layer conformally covering the bottom electrodes; and
a top electrode disposed on the dielectric layer and filling spaces between the plurality of bottom electrodes, between the plurality of conductive pads, and between the plurality of dielectric patterns.

12. The semiconductor device of claim 11, wherein at least one of the conductive lines has a protrusion that extends toward the substrate,
wherein the protrusion contacts the substrate.

13. The semiconductor device of claim 12, further comprising a plurality of peripheral transistors disposed below the plurality of conductive lines,
wherein the protrusion is configured to electrically connect the peripheral transistor to the plurality of conductive lines.

14. The semiconductor device of claim 11, wherein a lateral sidewall of each of the plurality of dielectric patterns is aligned with a lateral sidewall of one conductive pad of the plurality of conductive pads.

15. The semiconductor device of claim 11, wherein:
each of the plurality of conductive pads is connected in common to the plurality of bottom electrodes; and
the conductive pads are connected in parallel to each other.

16. The semiconductor device of claim 11, further comprising at least one support pattern that is configured to connect adjacent bottom electrodes to each other.

17. A semiconductor device, comprising:
a substrate including a cell array region and a peripheral circuit region that surrounds the cell array region, the peripheral circuit region including a first region and a second region that surrounds the first region;
a plurality of word lines disposed in the cell array region, the plurality of word lines extending in a first direction that is parallel to an upper surface of the substrate;
a plurality of bit lines that intersect the word lines and extend in a second direction that is parallel to the upper surface of the substrate and perpendicular to the first direction;
a plurality of first contacts disposed between the plurality of bit lines and the substrate;
a plurality of second contacts disposed between adjacent bit lines, the plurality of second contacts contacting the substrate;
a plurality of landing pads disposed on corresponding second contacts;
a first conductive pad disposed on the substrate in the first region;
a plurality of conductive lines disposed on the substrate in the second region, top surfaces of the conductive lines are located at a same level as a level of top surfaces of the landing pads and a top surface of the first conductive pad;
a second conductive pad disposed on and spaced apart from the conductive lines;
a dielectric pattern disposed between the conductive lines and the second conductive pad;
a plurality of first bottom electrodes disposed on and connected to corresponding landing pads in the cell array region;
a plurality of second bottom electrodes disposed on and connected in common to the first conductive pad in the first region; and
a plurality of third bottom electrodes disposed on and connected in common to the second conductive pad in the second region,
wherein a height between an uppermost surface and a lowermost surface of each of the plurality of first and second bottom electrodes is greater than a height between an uppermost surface and a lowermost surface of each of the plurality of third bottom electrodes, and
wherein top surfaces of the first, second, and third bottom electrodes are located at a same level.

18. The semiconductor device of claim 17, wherein the conductive lines are connected to corresponding bit lines on the cell array region.

19. The semiconductor device of claim 17, wherein each of the first and second bottom electrodes includes a first part and a second part disposed on the first part,
wherein the third bottom electrodes are located at a level that is higher than a level of a bottom-electrode boundary positioned at a boundary between the first part and the second part.

20. The semiconductor device of claim 19, further comprising:
a plurality of first support patterns that are configured to connect adjacent first parts to each other; and
a plurality of second support patterns that are configured to connect adjacent second parts to each other, wherein the plurality of first support patterns vertically overlap the plurality of second support patterns.

* * * * *